United States Patent
Park et al.

(10) Patent No.: US 11,687,191 B2
(45) Date of Patent: Jun. 27, 2023

(54) DISPLAY DEVICE

(71) Applicant: SAMSUNG DISPLAY CO., LTD., Yongin-si (KR)

(72) Inventors: Jae Hyun Park, Seoul (KR); Tae Joon Kim, Seongnam-si (KR); Jung Mok Park, Hwaseong-si (KR); Jung Goo Lee, Seoul (KR); Ji Yeong Lee, Seoul (KR); Hyun Wook Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/406,330

(22) Filed: Aug. 19, 2021

(65) Prior Publication Data

US 2022/0093694 A1    Mar. 24, 2022

(30) Foreign Application Priority Data

Sep. 22, 2020    (KR) ........................ 10-2020-0122471

(51) Int. Cl.
*G06F 3/044* (2006.01)
*G06F 3/041* (2006.01)

(52) U.S. Cl.
CPC ........ *G06F 3/04166* (2019.05); *G06F 3/0412* (2013.01); *G06F 3/0416* (2013.01); *G06F 3/044* (2013.01)

(58) Field of Classification Search
CPC .. G06F 3/0412; G06F 3/0416; G06F 3/04164; G06F 3/04166; G06F 3/0418; G06F 3/044; G06F 3/0443; G06F 3/0449; G06F 2203/04103; G06F 2203/04111; G06F 2203/04112; H01L 27/323; H01L 27/326
See application file for complete search history.

(56) References Cited

U.S. PATENT DOCUMENTS 10,146,365 B2 *  12/2018  Takahashi .......... G06F 3/04182
2017/0147143 A1 *  5/2017  Jung .................... G06F 3/0418

FOREIGN PATENT DOCUMENTS

EP       2629183 A2 *  8/2013  .......... G01R 27/2605
KR   10-2013-0094495 A *  8/2013

* cited by examiner

*Primary Examiner* — Julie Anne Watko
(74) *Attorney, Agent, or Firm* — F. Chau & Associates, LLC

(57) ABSTRACT

A display device includes a touch sensor, a touch driver, and display driver. The touch driver drives the touch sensor at a first frequency, provides touch driving signals to touch electrodes during a touch sensing period of a touch frame period, and stops providing the touch driving signals during a touch waiting period of the touch frame period. The display drivers drives a display panel at a second frequency lower than the first frequency in a first mode, provides scan signals to pixels during a display period of a display frame period, and stops providing the scan signals during a display waiting period of the display frame period. When the display driver switches from the first mode to a second mode, the display driver drives the display at a third frequency lower than the second frequency, and the touch driver increases the touch waiting period of the touch frame period.

21 Claims, 14 Drawing Sheets

DISPLAY DEVICE

CROSS-REFERENCE TO RELATED APPLICATION

This application claims priority to Korean Patent Application No. 10-2020-0122471, filed on Sep. 22, 2020, and all the benefits accruing therefrom under 35 U.S.C. § 119, the disclosure of which is incorporated by reference herein in its entirety.

BACKGROUND

1. Field

One or more embodiments described herein relate to a display device.

2. Description of the Related Art

Smart phones, digital cameras, notebook computers, navigation systems, smart televisions and other electronics have flat panel display devices. Examples include liquid crystal display (LCD) devices, field emission display (FED) devices, and organic light-emitting diode (OLED) display devices. Some of these display devices are equipped with a touch sensing unit that detects a touch input from a user and then calculates the location (e.g., coordinates) of the touch input for purposes of performing a certain operation. When the display unit and touch sensing unit are driven at the same time, image quality distortions may occur.

SUMMARY

One or more embodiments described herein provide a display device that reduces or minimizes image quality distortions while maintaining reliability of touch detection sensitivity, even during times when a display driving unit is operating in a low-speed driving mode.

In accordance with one or more embodiments, a display device includes a display panel including pixels; a touch sensor on the display panel and including touch electrodes; a touch driver configured to drive the touch sensor at a first frequency, provide touch driving signals to the touch electrodes during a touch sensing period of a touch frame period, and stop providing the touch driving signals during a touch waiting period of the touch frame period; and a display driver configured to drive the display panel at a second frequency lower than the first frequency in a first mode, provide scan signals to the pixels during a display period of a display frame period, and stop providing the scan signals during a display waiting period of the display frame period. When the display driver is switched from the first mode to a second mode, the display driver is configured to drive the display panel at a third frequency lower than the second frequency, and the touch driver is configured to increase the touch waiting period of the touch frame period.

In accordance with one or more embodiments, an apparatus a touch driver configured to drive a touch sensor of a display device, wherein the touch driver configured to: drive the touch sensor based on a first touch waiting period of a first touch frame period when a display driver of the display device is in a first mode, and drive the touch sensor based on a second touch waiting period of a second touch frame period when the display driver is in a second mode, wherein the first touch waiting period is different from the second touch waiting period and wherein the touch driver is configured to drive the touch sensor at a frequency different from at least one frequency of the display driver in the first mode or the second mode.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
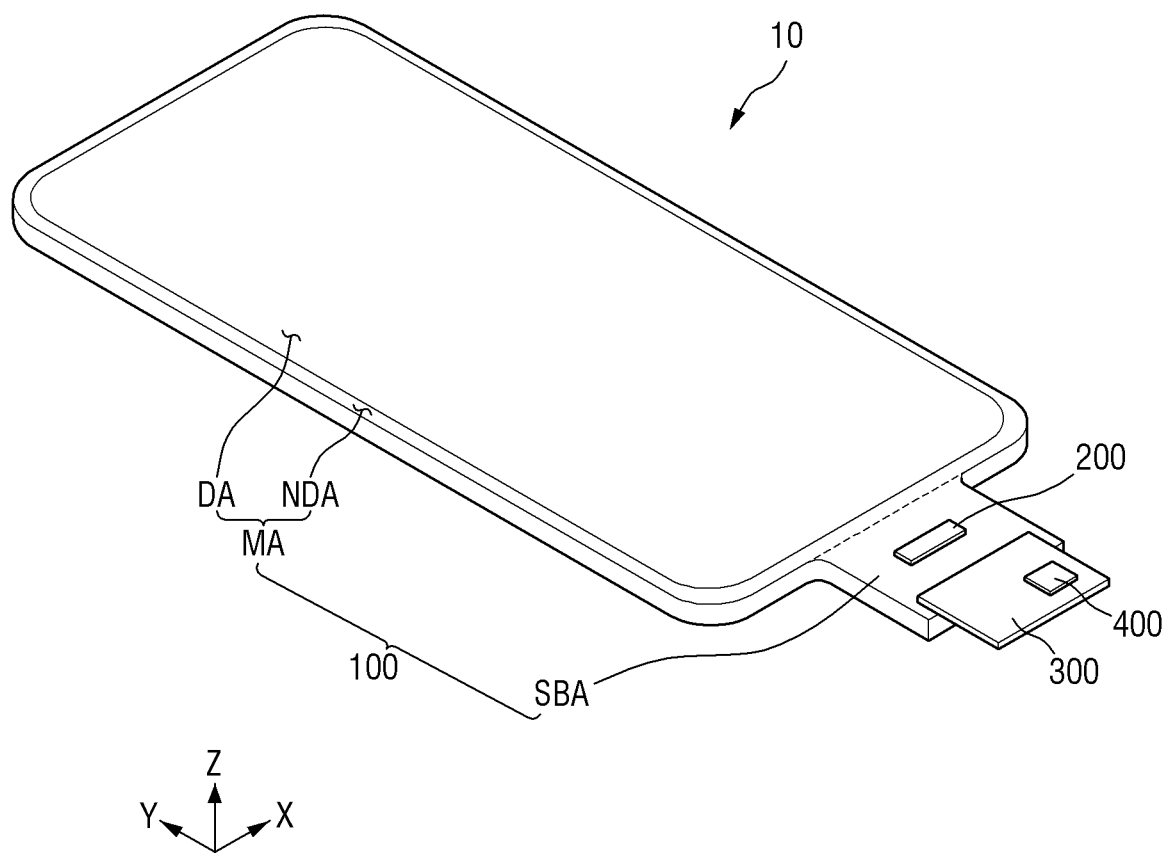
FIG. 1 illustrates an embodiment of a display device.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure pertains. Terms, such as those defined in used dictionaries, should be interpreted as having a meaning that is consistent with their meaning in the context of the relevant art and should not be interpreted in an idealized or overly formal sense, unless expressly defined herein.

FIG. 1 is a perspective view of an embodiment of a display device 10, which may be included in or coupled to a portable electronic device. Examples of the portable electronic device include a mobile phone, a smartphone, a tablet personal computer (PC), a mobile communication terminal, an electronic notepad, an electronic book (e-book), a portable multimedia player (PMP), a navigation device, or a ultra-mobile PC (UMPC). In one example, the display device 10 may be used as the display unit of a television (TV), a laptop computer, a monitor, a billboard, or an Internet-of-Things (IoT) device. In another example, the display device 10 may be applicable to a wearable device such as a smartwatch, a watchphone, a glasses display, or a head-mounted display (HMD). In another example, the display device 10 may be applicable to the dashboard, the center fascia, or the center information display (CID) of a vehicle, the room mirror display of a vehicle that can replace side-view mirrors, or an entertainment display disposed at the rear of the front seat of a vehicle.

In terms of orientation, a first direction (e.g., X-axis direction) may be the direction of the short sides of the display device 10, for example, a horizontal direction of the display device 10. A second direction (e.g., Y-axis direction) may be the direction of the long sides of the display device 10, for example, a vertical direction of the display device 10. A third direction (e.g., Z-axis direction) may be the thickness direction of the display device 10.

The display device 10 may have an almost rectangular shape in a plan view. For example, the display device 10 may have an almost rectangular shape with short sides in the first direction (or the X-axis direction) and long sides in the second direction (or the Y-axis direction) in a plan view. The corners at which the short sides and the long sides of the display device 10 meet may be rounded or right-angled. In another embodiment, the planar shape of the display device 10 may be various polygonal shapes, a circular shape, an elliptical shape or another shape.

Referring to FIG. 1, the display device 10 may include a display panel 100, a display driving unit (display driver) 200, a circuit board 300, and a touch driving unit (touch driver) 400.

The display panel 100 may include a main area MA and a subarea SBA. The main area MA may include a display area DA including pixels to display an image and a non-display area NDA around or otherwise adjacent to the display area DA. The display area DA may emit light through a plurality of emission areas or opening areas.

The display panel 100 may include pixel circuits including switching elements, a pixel defining film defining emission areas or opening areas, and self-light-emitting elements. The self-light-emitting elements may include, for example, organic light-emitting diodes (OLEDs) including organic light-emitting layers, quantum-dot light-emitting diodes (QLEDs) including quantum-dot light-emitting layers, inorganic light-emitting diodes (ILEDs) including inorganic semiconductors, and/or other types of light emitters.

The non-display area NDA may be outside the display area DA and, for example, may be defined as an edge area of the main area MA of the display area 100. The non-display area NDA may include a scan driving unit providing scan signals to scan lines and fan-out lines connecting the display driving unit 200 and the display area DA.

The subarea SBA may extend from one side of the main area MA. The subarea SBA may include a flexible material that is bendable, foldable, or rollable. For example, when the subarea SBA is bent, the subarea SBA may overlap with the main area MA in the third direction (or the Z-axis direction). The subarea SBA may include the display driving unit 200 and a pad unit, which is connected to the circuit board 300.

The display driving unit 200 may output signals and voltages to drive the display panel 100. The display driving unit 200 may provide data voltages to data lines, power supply voltages to power supply lines, and scan control signals to the scan driving unit. The display driving unit 200 may be formed as an integrated circuit (IC) and may be mounted on the display panel 100, for example, in a chip-on-glass (COG) or chip-on-plastic (COP) manner or via ultrasonic bonding. The display driving unit 200 may be disposed, for example, in the subarea SBA. When the subarea SBA is bent, the display driving unit 200 may overlap with the main area MA in the third direction (or the Z-axis direction). In one embodiment, the display driving unit 200 may be mounted on the circuit board 300, or may be coupled to the circuit board 300.

The circuit board 300 may be attached on the pad unit of the display panel 100 via an anisotropic conductive film (ACF). As a result, lead lines of the circuit board 300 may be electrically connected to the pad unit of the display panel 100. The circuit board 300 may be, for example, a flexible printed circuit board (FPCB), a printed circuit board (PCB), or a flexible film such as a chip-on-film (COF).

The touch driving unit 400 may be mounted on or coupled to the circuit board 300, and may be connected to the touch sensing unit of the display panel 100. The touch driving unit 400 may provide touch driving signals to a plurality of touch electrodes and may detect variations in capacitances (or resistances) of the touch electrodes. For example, the touch driving signals may include signals having a plurality of driving pulses. The touch driving unit 400 may detect the presence of touch input and calculate the touch coordinates of the touch input based on variations in the capacitances (or resistances) of the touch electrodes. In one embodiment, the touch driving unit 400 may be formed as an integrated circuit (IC).

Figure 2:
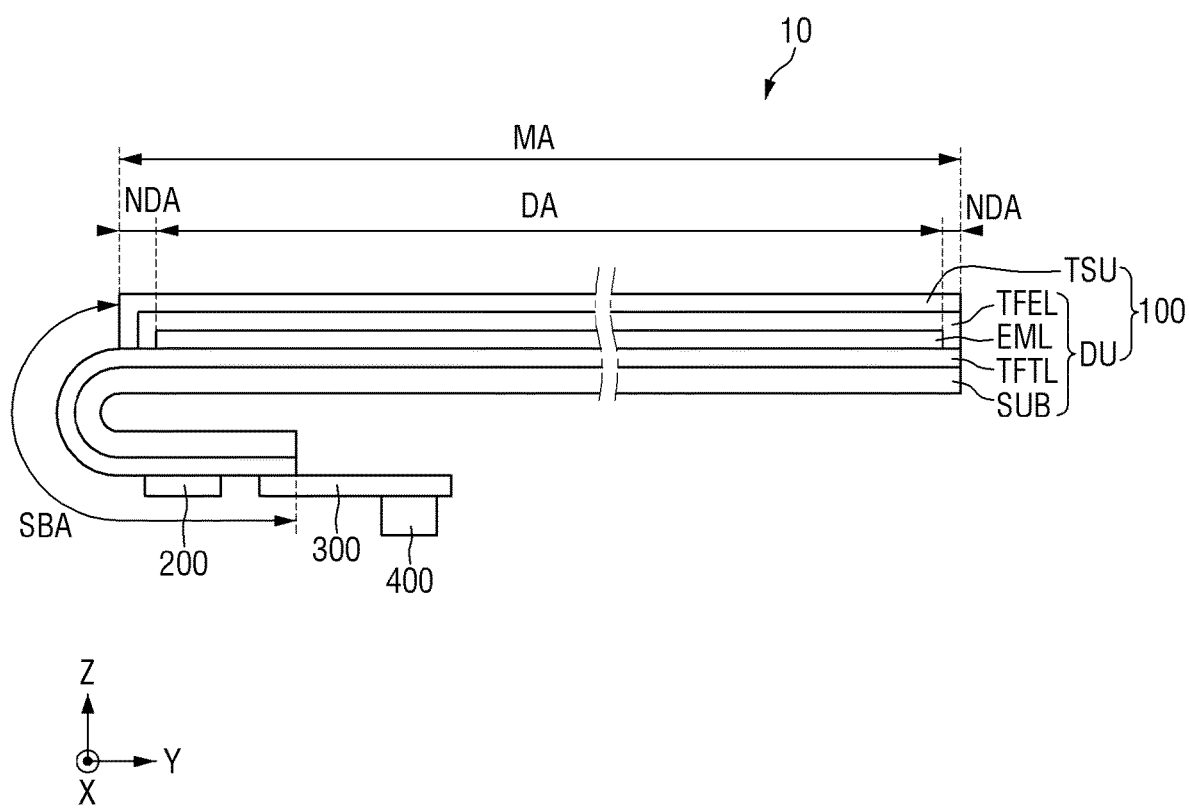
FIG. 2 illustrates a cross-sectional view of the display device.

FIG. 2 illustrates an embodiment of a cross-sectional view of the display device 10 of FIG. 1. Referring to FIG. 2, the display panel 100 may include a display unit DU and a touch sensing unit TSU. The display unit DU may include, for example, a substrate SUB, a thin-film transistor (TFT) layer TFTL, a light-emitting element layer EML, and an encapsulation layer TFEL.

The substrate SUB may be a base substrate or a base member and may be formed of an insulating material, e.g., a polymer resin. In one embodiment, the substrate SUB may be a flexible substrate that is bendable, foldable, or rollable. When the substrate SUB is a flexible substrate, the substrate SUB may be formed of polyimide (PI) or another material.

The TFT layer TFTL may be on the substrate SUB and may include a plurality of TFTs that form the pixel circuits of pixels. The TFT layer TFTL may include scan lines, data lines, power supply lines, scan control lines, and/or fan-out lines which connect the display driving unit 200 and the data lines. The TFT layer TFTL may also include pad connecting lines which connect the display driving unit 200 and the pad unit. Each of the TFTs may include a semiconductor region, a source electrode, a drain electrode, and a gate electrode. For example, the scan driving unit may include TFTs when the scan driving unit is formed on one side of the non-display area NDA of the display panel 100.

The TFT layer TFTL may be in the display area DA and the non-display area NDA. The TFTs, scan lines, data lines, and power supply lines of the TFT layer TFTL may be in the display area DA. The scan control lines, fan-out lines, and pad connecting lines of the TFT layer TFTL may be in the non-display area NDA.

The light-emitting element layer EML may be on the TFT layer TFTL. The light-emitting element layer EML may include a plurality of light-emitting elements (each of which includes a first electrode, emission layer, and a second electrode sequentially stacked) to emit light, and a pixel-defining film which defines pixels. The light-emitting elements of the light-emitting element layer EML may be in the display area DA.

The emission layers may include, for example, organic emission layers of an organic material. The light-emitting layers may include hole transport layers, organic light-emitting layers, and electron transport layers. As the first electrodes receive a predetermined voltage via the TFTs of the TFT layer TFTL and the second electrodes receive a cathode electrode, holes and electrons may move to the emission layers through the hole transport layer and the electron transport layers and may be combined together in the emission layers to emit light. For example, the first electrodes may be anode electrodes and the second electrodes may be cathode electrodes.

In one embodiment, the light-emitting element layers EML may include QLEDs including quantum-dot light-emitting layers or ILEDs including an inorganic semiconductor.

The encapsulation layer TFEL may cover the top surface and side surfaces of the light-emitting element layer EML to protect the light-emitting element layer EML. The encapsulation layer TFEL may include at least one inorganic film and at least one organic film for encapsulating the light-emitting element layer EML.

The touch sensing unit TSU may be on the encapsulation layer TFEL and may include a plurality of touch electrodes and sensing lines. The touch electrodes may detect a touch input from a user in a capacitive (or resistive) manner. The sensing lines may connect the touch electrodes and the touch driving unit 400. In some implementations, the touch sensing unit TSU may detect touch input from the user in a self-capacitive manner or a mutual capacitance manner.

In one embodiment, the touch sensing unit TSU may be on a separate substrate on the display unit DU. In this case, the substrate that supports the touch sensing unit TSU may be a base member that encapsulates the display unit DU.

The touch electrodes of the touch sensing unit TSU may be in a touch sensor area that overlaps with the display area DA. The sensing lines of the touch sensing unit TSU may be in a touch peripheral area that overlaps with the non-display area NDA.

A polarizing film and a cover window may be additionally disposed on the touch sensing unit TSU in some embodiments. The polarizing film may be on the touch sensing unit TSU, and the cover window may be on the polarizing film via an adhesive member.

The subarea SBA may extend from one side of the main area MA and may include a flexible material that is bendable, foldable, or rollable. When the subarea SBA is bent, the subarea SBA may overlap with the main area MA, for example, in the third direction (or the Z-axis direction). The subarea SBA may include the display driving unit 200 and the pad unit, which is connected to the circuit board 300.

Figure 3:
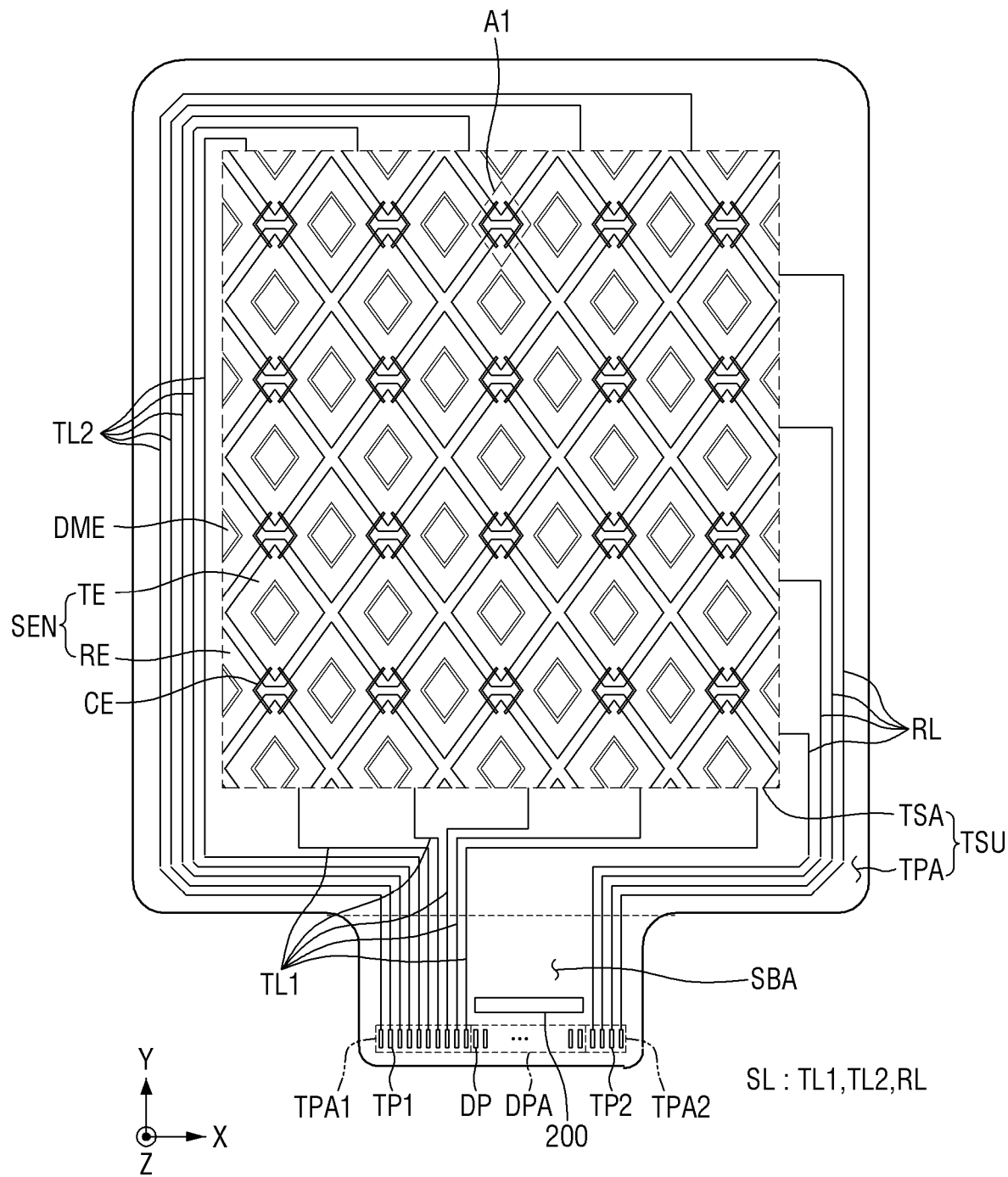
FIG. 3 illustrates an embodiment of a touch sensing unit.

FIG. 3 illustrates an embodiment of a plan view of the touch sensing unit TSU of the display device 10 of FIG. 1.

Referring to FIG. 3, the touch sensing unit TSU may include a touch sensor area TSA to detect a touch input from the user and a touch peripheral area TPA around or otherwise adjacent to the touch sensor area TSA. The touch sensor area TSA may overlap with the display area DA of the display panel 100. The touch peripheral area TPA may overlap with non-display area NDA.

The touch sensor area TSA may include a plurality of touch electrodes SEN and a plurality of dummy electrodes DME. The touch electrodes SEN may form mutual capacitances or self-capacitances to detect touch input from an object or a person. The touch electrodes SEN may include a plurality of driving electrodes TE and a plurality of sensing electrodes RE. For example, the driving electrodes TE may be defined as first touch electrodes, and the sensing electrodes RE may be defined as second touch electrodes. In one embodiment, the driving electrodes TE may be defined as second touch electrodes, and the sensing electrodes RE may be defined as first touch electrodes.

The driving electrodes TE may be arranged in the first direction (e.g., X-axis direction) and the second direction (e.g., Y-axis direction). The driving electrodes TE may be spaced apart from one another in the first direction (e.g., X-axis direction) and in the second direction (e.g., Y-axis direction). Each pair of adjacent driving electrodes TE in the second direction (e.g., the Y-axis direction) may be electrically connected via bridge electrodes CE.

The driving electrodes TE may be connected to first touch pad units TP1 via first driving lines TL1 and second driving lines TL2. For example, driving electrodes TE in the lower part of the touch sensor area TSA may be connected to the first touch pad units TP1 via the first driving lines TL1. In this case, driving electrodes TE in the upper part of the touch sensor area TSA may be connected to the first touch pad units TP1 via the second driving lines TL2. The first driving lines TL1 may extend to the first touch pad units TP1 through the lower part of the touch peripheral area TPA. The second driving lines TL2 may extend to the first touch pad units TP1 through the upper, left, and lower parts of the touch peripheral area TPA. The first touch pad units TP1 may be connected to the touch driving unit 400 via the circuit board 300.

The bridge electrodes CE may be bent at least once. For example, the bridge electrodes CE may be in the shape of angle brackets (e.g., "<" and ">"), but the shape of the bridge electrodes CE may be different from angle brackets in another embodiment. Each pair of adjacent driving electrodes TE in the second direction (Y-axis direction) may be connected by multiple bridge electrodes CE. Thus, even if one of the bridge electrodes CE is disconnected, the driving electrodes TE can be stably connected via the other non-disconnected bridge electrodes CE. In one embodiment, each pair of adjacent driving electrodes TE may be connected by two bridge electrodes CE or another number of bridge electrodes CE.

The bridge electrodes CE may be in a different layer from the driving electrodes TE and the sensing electrodes RE. Each pair of adjacent sensing electrodes RE in the first direction (X-axis direction) may be electrically connected via connectors in the same layer as the driving electrodes TE or the sensing electrodes RE. Each pair of adjacent driving electrodes TE in the second direction (Y-axis direction) may be electrically connected via bridge electrodes CE in a different layer from the driving electrodes TE or the sensing electrodes RE. Thus, even if the bridge electrodes CE overlap with the sensing electrodes RE in the third direction (Z-axis direction), the driving electrodes TE can be insulated from the sensing electrodes RE. Mutual capacitances may be formed between the driving electrodes TE and the sensing electrodes RE.

The sensing electrodes RE may extend in the first direction (X-axis direction) and may be spaced apart from one another in the second direction (Y-axis direction). The sensing electrodes RE may be arranged in the first direction (X-axis direction) and the second direction (Y-axis direction), and each pair of adjacent sensing electrodes RE in the first direction (X-axis direction) may be electrically connected by a connector.

The sensing electrodes RE may be connected to second touch pad units TP2 via sensing lines RL. For example, sensing electrodes RE on a right part of the touch sensor area TSA may be connected to the second touch pad part TP2 via the sensing lines RL. The sensing lines RL may extend to the second touch pad units TP2 through the right and lower parts of the touch peripheral area TPA. The second touch pad units TP2 may be connected to the touch driving unit 400 via the circuit board 300.

Each of the dummy electrodes DME may be surrounded by the driving electrodes TE or the sensing electrodes RE. Each of the dummy electrodes DME may be spaced apart from, and insulated by, the driving electrodes TE or the sensing electrodes RE. Thus, the dummy electrodes DME may be electrically floated.

In one embodiment, the driving electrodes TE, the sensing electrodes RE, and the dummy electrodes DME may have a rhombus shape in a plan view, but may have a different shape in another embodiment. For example, the driving electrodes TE, the sensing electrodes RE, and the dummy electrodes DME may have a rectangular shape, a non-tetragonal polygonal shape, a circular shape, an elliptical shape, or another shape in a plan view.

A display pad area DPA, a first touch pad area TPA1, and a second touch pad area TPA2 may be on one edge of the subarea SBA of the display panel 100. The display pad area DPA, the first touch pad area TPA1, and the second touch pad area TPA2 may be electrically connected to the circuit board 300 via a low-resistance, high-reliability material, such as an ACF or a self-assembly anisotropic conductive paste (SAP).

The display pad area DPA may include a plurality of display pad units DP connected to a main processor via the circuit board 300. The display pad units DP may be connected to the circuit board 300 to receive digital video data or to provide digital video data to the display driving unit 200.

The first touch pad area TPA1 may be on one side of the display pad area DPA and may include a plurality of first touch pad units TP1. The first touch pad units TP1 may be electrically connected to the touch driving unit 400 disposed on the circuit board 300. The first touch pad units TP1 may provide touch driving signals to the driving electrodes TE via the first driving lines TL1.

The second touch pad area TPA2 may be on another (e.g., opposing) side of the display pad area DPA and may include a plurality of second touch pad units TP2. The second touch pad units TP2 may be electrically connected to the touch driving unit 400 disposed on the circuit board 300. The second touch pad units TP2 may receive touch sensing signals via the sensing lines RL, which are connected to the second touch pad units TP2, and may detect variations in mutual capacitances between the driving electrodes TE and the sensing electrodes RE.

In one embodiment, the touch driving unit 400 may provide touch driving signals to the driving electrodes TE and the sensing electrodes RE and may receive touch sensing signals from the driving electrodes TE and the sensing electrodes RE. The touch driving unit 400 may detect charge variations in the driving electrodes TE and sensing electrodes RE based on touch sensing signals.

Figure 4:
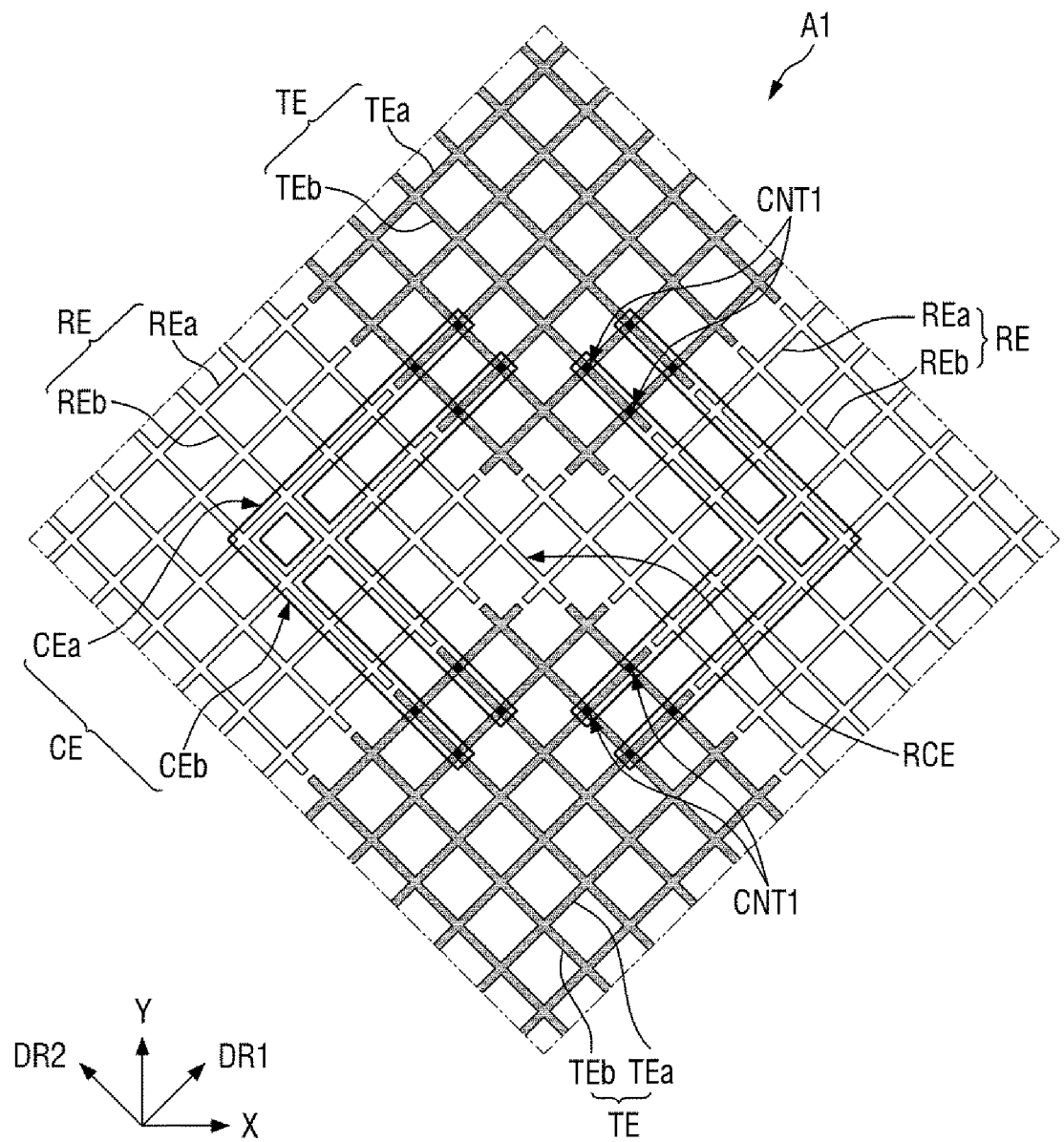
FIG. 4 illustrates an example of an enlarged plan view of area A1 in FIG. 3.
Figure 5:
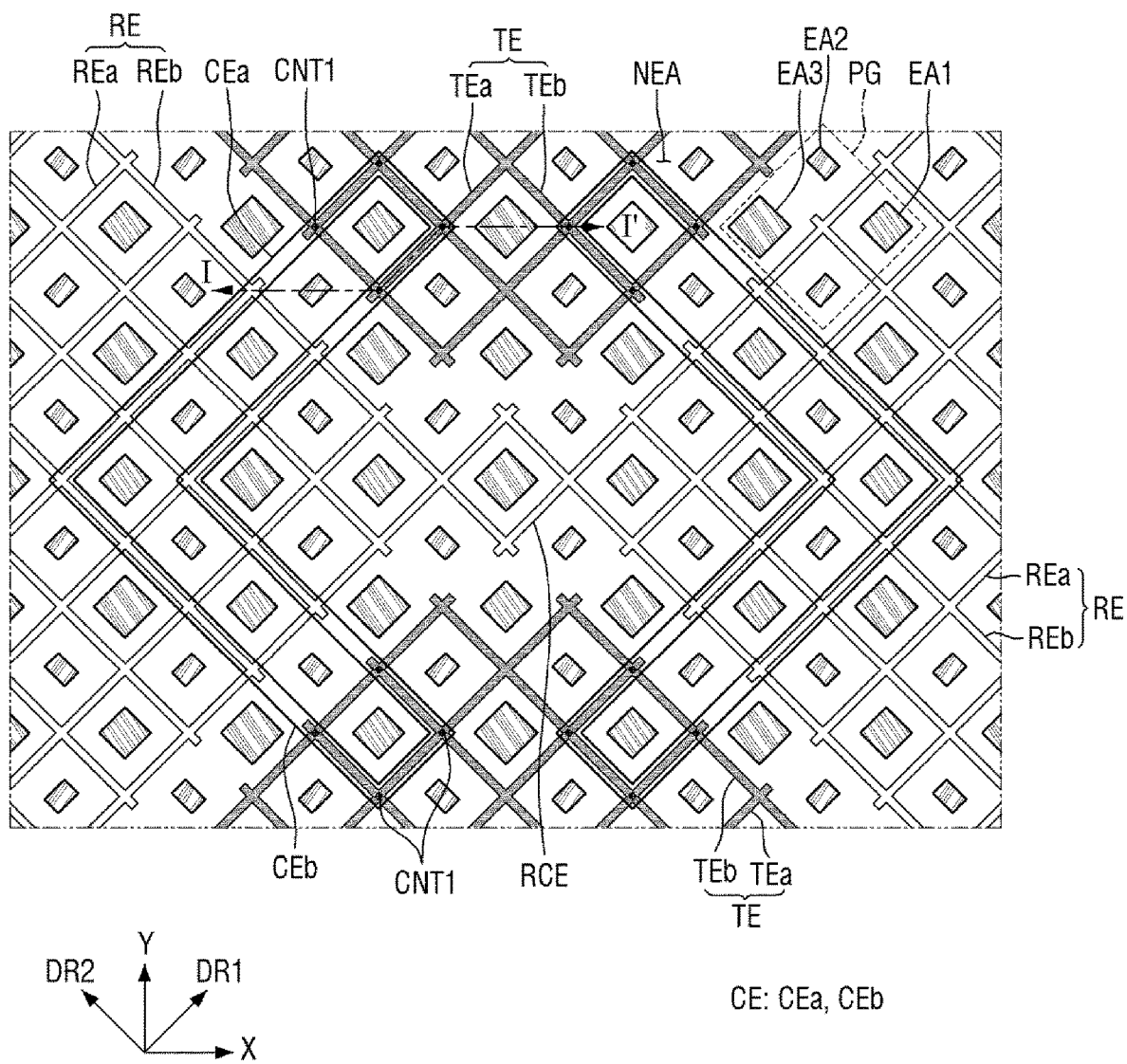
FIG. 5 illustrates an example of an enlarged plan view of part of the display device.

FIG. 4 illustrates an embodiment of an enlarged plan view of an area A1 of FIG. 3, and FIG. 5 illustrates an embodiment of an enlarged plan view of part of the display device 10 of FIG. 1. Referring to FIGS. 4 and 5, the driving electrodes TE, the sensing electrodes RE, and the dummy electrodes DME may be in the same layer and may be spaced apart from one another.

The driving electrodes TE may be arranged in the first direction (X-axis direction) and the second direction (Y-axis direction). The driving electrodes TE may be spaced apart from one another in the first direction (X-axis direction) and the second direction (Y-axis direction). Each pair of adjacent driving electrodes TE in the second direction (Y-axis direction) may be electrically connected by bridge electrodes CE.

The bridge electrodes CE may be bent at least once. For example, the bridge electrodes CE may be in the shape of angle brackets (e.g., "<" and ">"), but may have a different shape in another embodiment. Each pair of adjacent driving electrodes TE in the second direction (Y-axis direction) may be connected by multiple bridge electrodes CE. Thus, even if one of the bridge electrodes CE is disconnected, the driving electrodes TE can be stably connected via the other non-disconnected bridge electrodes CE. In some embodiments, each pair of adjacent driving electrodes TE may be connected by two bridge electrodes CE or another number of bridge electrodes CE.

The sensing electrodes RE may extend in the first direction (X-axis direction) and may be spaced apart from one another in the second direction (Y-axis direction). The sensing electrodes RE may be arranged in the first direction (X-axis direction) and the second direction (Y-axis direction). Each pair of adjacent sensing electrodes RE in the first direction (X-axis direction) may be electrically connected by a connector RCE. The connector RCE may be disposed, for example, within the shortest distance of a corresponding pair of adjacent driving electrodes TE.

A plurality of bridge electrodes CE may be in a different layer from the driving electrodes TE and the sensing electrodes RE. Each of the bridge electrodes CE may include first and second portions CEa and CEb. For example, the second portion CEb of each of the bridge electrodes CE may be connected to a driving electrode TE via first contact holes CNT1 to extend in a direction DR2. The first portion CEa of each of the bridge electrodes CE may be bent (or angled) from the second portion CEb of a corresponding bridge electrode CE to extend in a direction DR1, in an area that overlaps with a sensing electrode SE, and may be connected to a driving electrode TE via first contact holes CNT1. The direction DR1 may be a direction between the first direction (X-axis direction) and the second direction (Y-axis direction), and the direction DR2 may intersect the direction DR1. Thus, each of the bridge electrodes CE may connect a pair of adjacent driving electrodes TE in the second direction (Y-axis direction).

The driving electrodes TE, the sensing electrodes RE, and the dummy electrodes DME may form, for example, a mesh or fishnet shape in a plan view. Thus, in one embodiment, the driving electrodes TE, the sensing electrodes RE, and the dummy electrodes DME may not overlap with first, second, and third emission areas EA1, EA2, and EA3 of each of a plurality of pixel groups PG. Also, in an embodiment, the bridge electrodes BE may not overlap with the first, second, and third emission areas EA1, EA2, and EA3 of each of the pixel groups PG. Thus, the display device 10 can prevent the luminance of light emitted from the first, second, and third emission areas EA1, EA2, and EA3 of each of the pixel groups PG from being lowered by the touch sensing unit TSU.

Each of the driving electrodes TE may include first and second portions TEa and TEb, which respectively extend in the directions DR1 and DR2. Each of the sensing electrodes RE may include first and second portions REa and REb, which respectively extend in the directions DR1 and DR2.

In one embodiment, the driving electrodes TE, the sensing electrodes RE, and the dummy electrodes DME may form a plate structure, rather than a mesh or fishnet structure, in a plan view. In this example, the driving electrodes TE, the sensing electrodes RE, and the dummy electrodes DME may include a transparent conductive material with high light transmittance (e.g., indium tin oxide (ITO), indium zinc oxide (IZO), etc.) and thus may be able to prevent the luminance of light emitted from the first, second, and third emission areas EA1, EA2, and EA3 of each of the pixel groups PG from being lowered.

Each of a plurality of pixels may include first, second, and third subpixels, which respectively include first, second, and third emission areas EA1, EA2, and EA3. For example, the first emission area EA1 may emit first-color light or red light, the second emission area EA2 may emit second-color light or green light, and the third emission area EA3 may emit third-color light or blue light. The subpixels may emit a different combination of light in another embodiment.

Here, the first, second, and third areas EA1, EA2, and EA3 may have a rhombus or rectangular shape in a plan view, but may have a different shape in another embodiment. For example, the first, second, and third areas EA1, EA2, and EA3 may have a non-tetragonal polygonal shape, a circular shape, or an elliptical shape in a plan view. Also, in one embodiment, the third emission area EA3 may have a largest size and the second emission area EMA2 may have a smallest size, but these sizes may be different in other embodiments.

A single pixel group PG may include one first emission area EA1, two second emission areas EA2, and one third emission area EA3 and therefore may display a white gradation, e.g., a white gradation may be displayed based on the combination of light emitted from one first emission area EA1, light emitted from two second emission areas EA2, and light emitted from one third emission area EA3.

Second emission areas EA2 may be arranged in odd-numbered rows and, for example, may be successively arranged in the first direction (or the X-axis direction) in each of the odd-numbered rows. In one embodiment, one of each pair of adjacent second emission areas EA2 may have two long sides in the first direction DR1 and two short sides in the direction DR2. The other second emission area EA2 may have two long sides in the second direction DR2 and two short sides in direction DR1. This arrangement may differ in other embodiments.

First emission areas EA1 and third emission areas EA3 may be arranged in even-numbered rows. In one embodiment, the first emission areas EA1 and the third emission areas EA3 may be alternately arranged in each of the even-numbered rows. This arrangement may differ in other embodiments.

Figure 6:
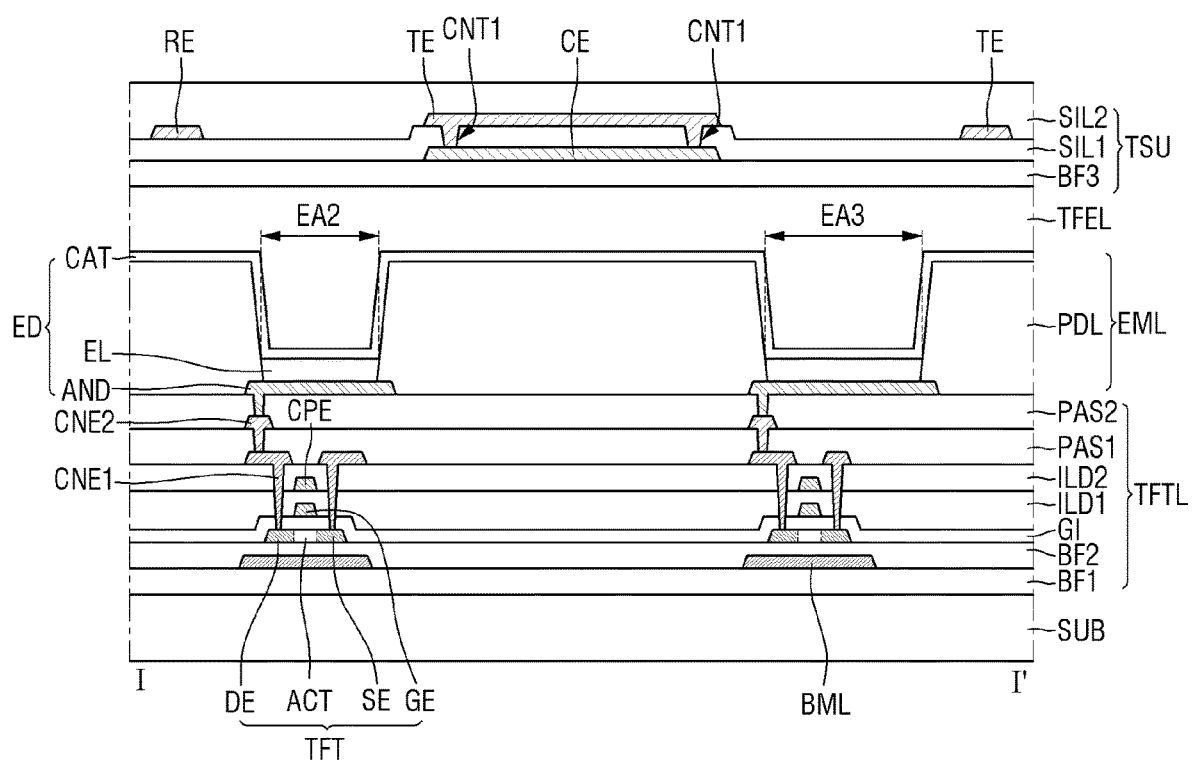
FIG. 6 illustrates an example of a cross-sectional view along line I-I' of FIG. 5.

FIG. 6 illustrates an embodiment of a cross-sectional view taken along line I-I' of FIG. 5. Referring to FIG. 6, the display panel 100 may include the display unit DU and the touch sensing unit TSU. The display unit DU may include the substrate SUB, the TFT layer TFTL, the light-emitting element layer EML, and the encapsulation layer TFEL. The substrate SUB may support the display panel 100 and may be a base substrate or a base member formed of an insulating material, e.g., a polymer resin. In one embodiment, the substrate SUB may be a flexible substrate that is bendable, foldable, or rollable. In one embodiment, the substrate SUB may include a flexible material and a rigid material.

The TFT layer TFTL may include first and second buffer layers BF1 and BF2, TFTs, a gate insulating film GI, a first interlayer insulating film ILD1, capacitor electrodes CPE, a second interlayer insulating film ILD2, first connecting electrodes CNE1, a first passivation layer PAS1, second connecting electrodes CNE2, and a second passivation layer PAS2.

The first buffer layer BF1 may be on the substrate SUB and may include one or more inorganic films capable of preventing the penetration of the air or moisture. For example, the first buffer layer BF1 may include a plurality of inorganic films that are alternately stacked. In one embodiment, a light-blocking layer BML may be on the first buffer layer BF1. The light-blocking layer BML may be formed as a single layer or a multilayer, including, for example, molybdenum (Mo), aluminum (Al), chromium (Cr), gold (Au), titanium (Ti), nickel (Ni), neodymium (Nd), copper (Cu), or an alloy thereof. In one embodiment, the light-blocking layer BML may be an organic film including a black pigment.

The second buffer layer BF2 may cover the first buffer layer BF1 and the light-blocking layer BML. The second buffer layer BF2 may include one or more inorganic films capable of preventing penetration of the air or moisture. For example, the second buffer layer BF2 may include a plurality of inorganic films that are alternately stacked.

The TFTs may be on the second buffer layer BF2 and may be included the pixel circuit of each pixel. The TFTs may include driving and/or switching transistors of the pixel circuit, and also may include semiconductor regions ACT, gate electrodes GE, source electrodes SE, and drain electrodes DE. The semiconductor regions ACT, the source electrodes SE, and the drain electrodes DE may be on the second buffer layer BF2. The semiconductor regions ACT may overlap with the gate electrodes GE in a thickness direction and may be insulated from the gate electrodes GE by the gate insulating film GI. The source electrodes SE and the drain electrodes DE may be provided by turning the material of the semiconductor regions ACT into conductors. The gate electrodes GE may be on the gate insulating film GI and may overlap with the semiconductor regions ACT with the gate insulating film GI interposed therebetween.

The gate insulating film GI may be provided on the semiconductor regions ACT, the source electrodes SE, and the drain electrodes DE. For example, the gate insulating film GI may cover the semiconductor regions ACT, the source electrodes SE, the drain electrodes DE, and the second buffer layer BF2 and may insulate the semiconductor regions ACT from the gate electrodes GE. The gate insulating film GI may include contact holes that are penetrated by the first connecting electrodes CNE1.

The first interlayer insulating film ILD1 may cover the gate electrodes GE and the gate insulating film GI, and may include contact holes that are penetrated by the first connecting electrodes CNE1. The contact holes of the first interlayer insulating film ILD1 may be connected to the contact holes of the gate insulating film GI and the contact holes of the second interlayer insulating film ILD2.

The capacitor electrodes CPE may be on the first interlayer insulating film ILD1 and may overlap with the gate electrodes GE in the third direction (Z-axis direction). For example, the capacitor electrodes CPE may be formed as single layers or multilayers, including, for example, at least one of Mo, Al, Cr, Au, Ti, Ni, Nd, Cu, or an alloy thereof.

The second interlayer insulating layer ILD2 may cover the capacitor electrodes CPE and the first interlayer insulating film ILD1. The second interlayer insulating film ILD2 may include contact holes that are penetrated by the first connecting electrodes CNE1. The contact holes of the second interlayer insulating film ILD2 may be connected to the contact holes of the first interlayer insulating film ILD1 and the contact holes of the gate insulating film GI.

The first connecting electrodes CNE1 may be on the second interlayer insulating film ILD2 and may connect the drain electrodes DE of the TFTs and the second connecting electrodes CNE2. The first connecting electrodes CNE1 may be inserted in the contact holes of the second interlayer insulating film ILD2, the contact holes of the first interlayer insulating film ILD1, and the contact holes of the gate insulating film GI, and thus may be in contact with the drain electrodes DE of the TFTs.

The first passivation layer PAS1 may cover the first connecting electrodes CNE1 and the second interlayer insulating film ILD2, and may protect the TFTs "TFT". The first passivation layer PAS1 may include contact holes that are penetrated by the second connecting electrodes CNE2.

The second connecting electrodes CNE2 may be on the first passivation layer PAS1 and may connect the first connecting electrodes CNE1 and first electrodes AND of light-emitting elements ED. The second connecting electrodes CNE2 may be inserted in the contact holes of the first passivation layer PAS1 and thus may be in contact with the first connecting electrodes CNE1.

The second passivation layer PAS2 may cover the second connecting electrodes CNE2 and the first passivation layer PAS1. The second passivation layer PAS2 may include contact holes that are penetrated by the first electrodes AND of the light-emitting elements ED.

In each pixel circuit, the light-emitting element EML may be on the TFT layer TFTL and may include light-emitting element ED and a pixel-defining film PDL. The light-emitting element ED may include a first electrode AND, an emission layer EL, and a second electrode CAT. The first electrode AND may be on the second passivation layer PAS2 and may be disposed to overlap with one of first, second, and third emission areas EA1, EA2, and EA3, which are defined by the pixel-defining film PDL. The first electrode AND may be connected to the drain electrode DE of the TFT through the first connecting electrode CNE1 and the second connecting electrode CNE2.

Also, in each pixel circuit, emission layer EL may be on the first electrode AND. The emission layer EL may be, for example, an organic emission layer including an organic material. In this example, when the TFT applies a predetermined voltage to the first (anode) electrode AND and a second (cathode) electrode CAT receives a common voltage, holes and electrons may move to the emission layer EL through the hole transport layer and electron transport layer. The holes and electrons may combine together in the emission layer EL to emit light.

The second electrode CAT may be on the emission layer EL and, for example, may be implemented as a common electrode for all pixels. In one embodiment, the second electrode CAT may be on the emission layers EL in the first, second, and third emission areas EA1, EA2, and EA3 and on the pixel-defining film PDL in areas other than the first, second, and third emission areas EA1, EA2, and EA3. The pixel-defining film PDL may define the first, second, and third emission areas EA1, EA2, and EA3 and may separate and insulate the first electrodes AND from one another.

The encapsulation layer TFEL may be on the second electrode CAT and may cover the light-emitting elements ED. The encapsulation layer TFEL may include at least one inorganic film that prevents oxygen or moisture from penetrating into the light-emitting element layer EML. The encapsulation layer TFEL may include, for example, at least one inorganic film that includes a silicon nitride layer, a silicon oxynitride layer, a silicon oxide layer, a titanium oxide layer, an aluminum oxide layer and/or a layer of another material. The encapsulation layer TFEL may include at least one organic film that protects the light-emitting element layer EML from a foreign material such as dust. The encapsulation layer TFEL may include, for example, an acrylic resin, an epoxy resin, a phenolic resin, a polyamide resin, or a polyimide resin.

The touch sensing unit TSU may be on the encapsulation layer TFEL and may include a third buffer layer BF3, a bridge electrode CE, a first insulating film SIL1, driving electrodes TE, sensing electrodes RE, and a second insulating film SIL2. The third buffer layer BF3 may be on the encapsulation layer TFEL and may perform an insulating function and an optical function. The third buffer layer BF3 may include at least one inorganic film. In one embodiment, the third buffer layer BF3 may be formed as a stacked multifilm. The multifilm may include at least one inorganic film, including, for example, a silicon nitride layer, a silicon oxynitride layer, a silicon oxide layer, a titanium oxide layer, and/or an aluminum oxide layer. In some embodiments, the third buffer layer BF3 may not be provided.

The bridge electrode CE may be on the third buffer layer BF3 and may be in a different layer from the driving electrodes TE and the sensing electrodes RE. The bridge electrode CE may also connect a pair of adjacent driving electrodes TE in the second direction (Y-axis direction). The bridge electrode CE may be formed as a single layer including, for example, Mo, Ti, Cu, or Al or as a stack of Al and Ti (e.g., Ti/Al/Ti), a stack of Al and ITO (e.g., ITO/Al/ITO), an Ag—Pd—Cu (APC) alloy, or a stack of an APC alloy and ITO (e.g., ITO/APC/ITO).

A first insulating layer SIL1 may cover the bridge electrode CE and the third buffer layer BF3, and may perform an insulating function and an optical function. For example, the first insulating layer SIL1 may be formed as an inorganic film including, for example, a silicon nitride layer, a silicon oxynitride layer, a silicon oxide layer, a titanium oxide layer, or an aluminum oxide layer.

The driving electrodes TE and the sensing electrodes RE may be on the first insulating layer SIL1 and may not overlap with the first, second, and third emission areas EA1, EA2, and EA3. The driving electrodes TE and the sensing electrodes RE may each be formed as a single layer, including, for example, Mo, Ti, Cu, or Al or as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

A second insulating layer SIL2 may cover the driving electrodes TE, the sensing electrodes RE, and the first insulating layer SIL1, and may perform an insulating function and an optical function. For example, the second insulating layer SIL2 may be formed of one of the above-described exemplary materials that can be used to form the first insulating layer SIL1.

Figure 7:
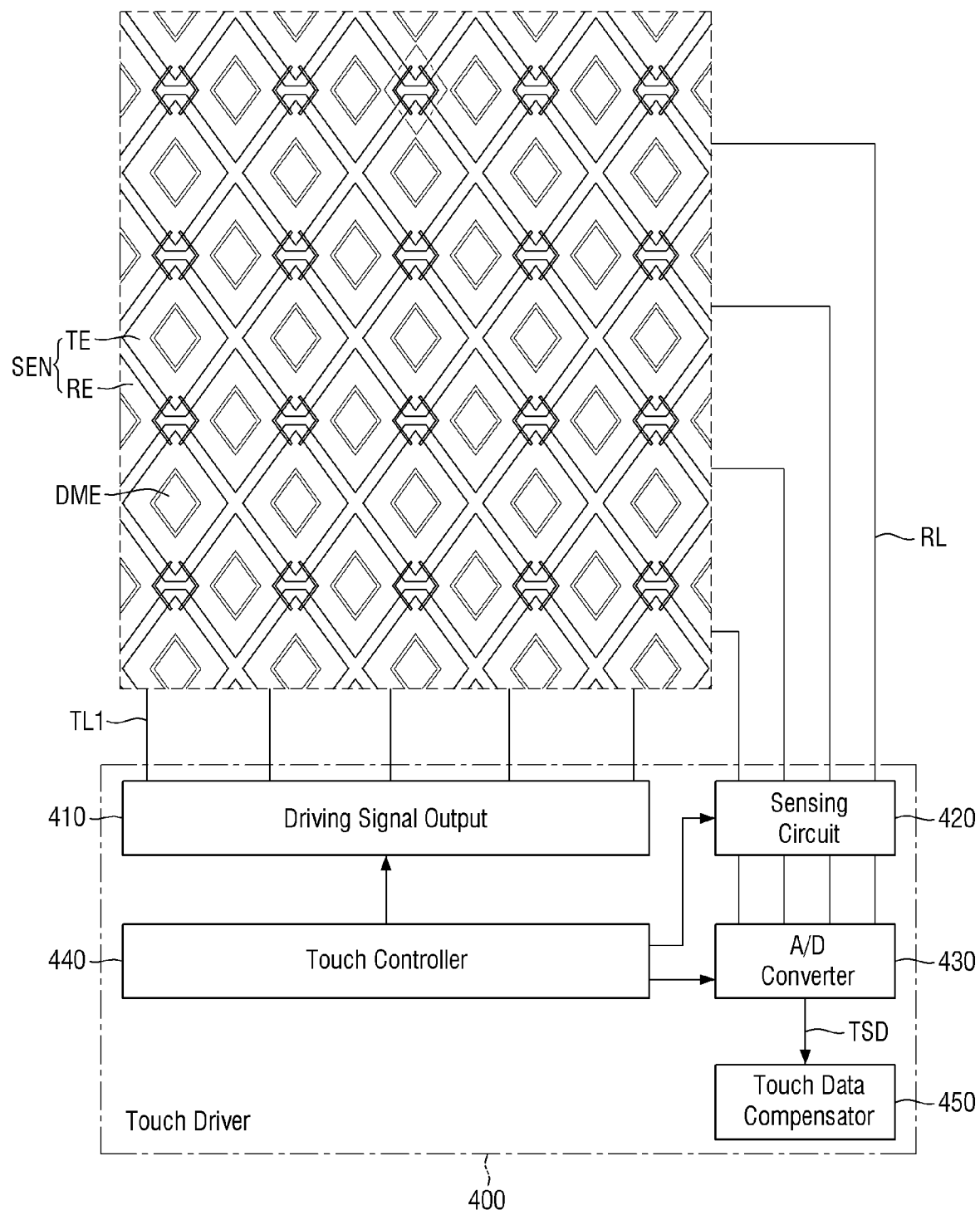
FIG. 7 illustrates an embodiment of a touch sensing unit and a touch driving unit.

FIG. 7 is a block diagram of an embodiment of display device 10 of FIG. 1, including the touch sensing unit and the touch driving unit 400.

Referring to FIG. 7, the touch driving unit (touch driver) 400 may include a driving signal output part (driving signal output) 410, a sensing circuit part (sensing circuit) 420, an analog-to-digital conversion part (A/D converter) 430, a touch control part (touch controller) 440, and a touch data compensation part (touch data compensator) 450. The driving signal output part 410 may be connected to a plurality of driving electrodes TE via first driving lines TL1. The driving signal output part 410 may provide touch driving signals to the driving electrodes TE. The touch driving signals may include a plurality of driving pulses. The driving signal output part 410 may provide the touch driving signals to the first driving lines TL1 in a predefined order. For example, the driving signal output part 410 may sequentially output the touch driving signals to the driving electrodes TE, ranging from driving electrodes TE on one side of the touch sensor area TSA to driving electrodes TE on the other side of the touch sensor area TSA.

The sensing circuit part 420 may be connected to a plurality of sensing electrodes RE via sensing lines RL. The sensing circuit part 420 may sense variations in mutual capacitances between the driving electrodes TE and the sensing electrodes RE via the sensing lines RL.

In one embodiment, the driving signal output part 410 may provide touch driving signals to the touch electrodes TE, and the sensing circuit part 420 may provide touch driving signals to the sensing electrodes RE. In this case, the driving signal output part 410 may sense charge variations in the touch electrodes TE, and the sensing circuit part 420 may sense charge variations in the sensing electrodes RE. Thus, the driving signal output part 410 and the sensing circuit part 420 may sense variations in self-capacitances of the touch electrodes TE and the sensing electrodes RE.

The analog-to-digital conversion part 430 may convert an output voltage of the sensing circuit part 420 to touch sensing data TSD, which is digital data. The analog-to-digital conversion part 430 may provide touch sensing data TSD to the touch data compensation part 450.

The touch control part 440 may control the driving signal output part 410, the sensing circuit part 420, and the analog-to-digital conversion part 430. In one embodiment, the touch control part 440 may output timing signals for synchronizing the driving signal output part 410, the sensing circuit part 420, and the analog-to-digital conversion part 430 to the driving signal output part 410, the sensing circuit part 420, and the analog-to-digital conversion part 430.

The touch data compensation part 450 may receive the touch sensing data TSD (which is sensed from the touch electrodes TE and the sensing electrodes RE) from the analog-to-digital conversion part 430. The touch data compensation part 450 may calculate the presence of a touch input from a user and the touch coordinates of the touch input, by analyzing the touch sensing data TSD.

Figure 8:
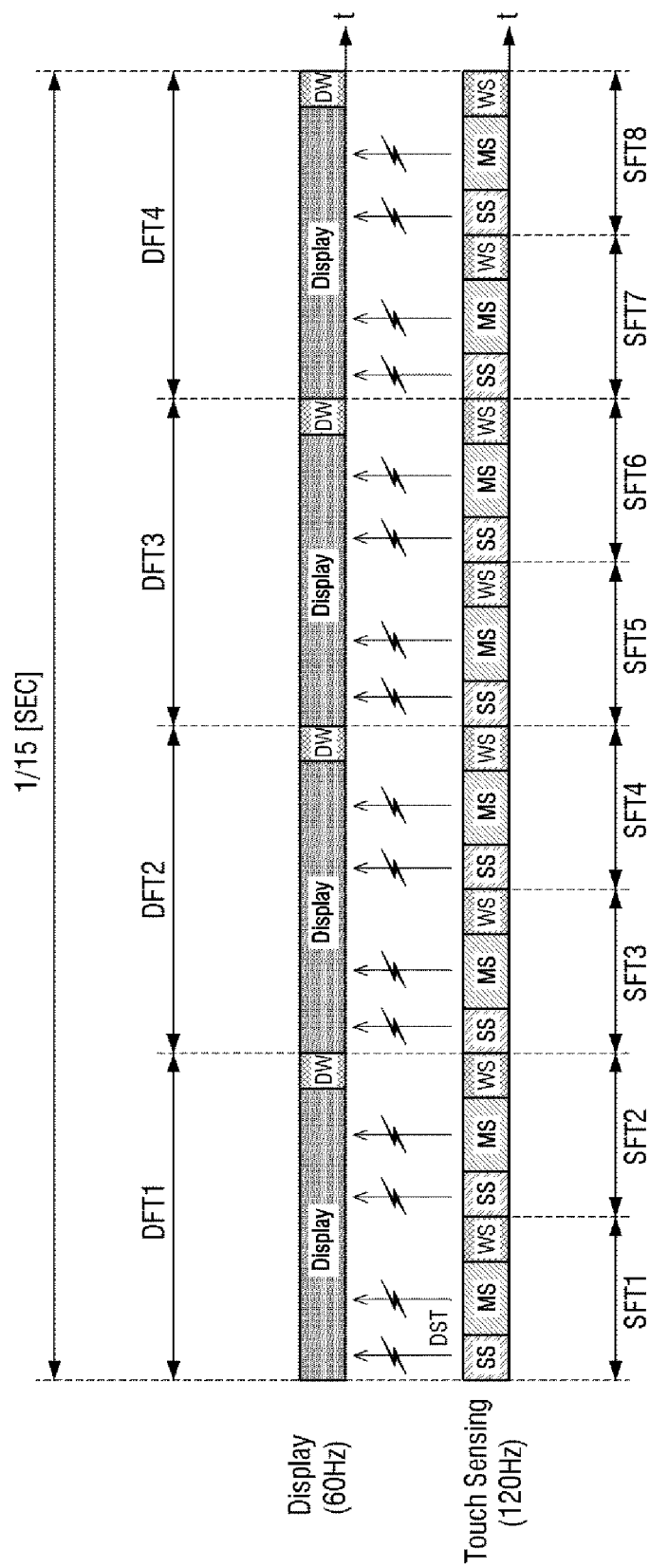
FIG. 8 illustrates an embodiment of a timing diagram for operating a display driving unit and touch driving unit in a first (or normal) mode.

FIG. 8 is a timing diagram illustrating operations of the display driving unit and the touch driving unit of the display device of FIG. 1 in a first (normal) mode, according to an embodiment. Normal mode may correspond, for example, to a mode in which the display driving unit 200 drives the display unit DU at a first driving frequency, e.g., 60 Hz. As will be discussed in greater detail below, a second (first slow) mode may correspond, for example to a mode in which the display driving unit 200 drives the display unit DU at a second driving frequency, e.g., 40 Hz. A third (second slow) mode may correspond, for example, to a mode in which the display driving unit 200 drives the display unit DU at a third driving frequency, e.g., 30 Hz. The driving frequencies of the normal mode, the first slow mode, and/or the second slow mode may be different in another embodiment.

Referring to FIG. 8, in normal mode, the display driving unit 200 may drive the display unit DU at a driving frequency of 60 Hz. The display driving unit 200 may provide scan signals and data voltages to a plurality of pixels during display periods ("Display") of first, second, third, and fourth display frame periods DFT1, DFT2, DFT3, and DFT4. The display driving unit 200 may stop providing the scan signals and the data voltages during display waiting periods DW of the first, second, third, and fourth display frame periods DFT1, DFT2, DFT3, and DFT4.

In one embodiment, the display driving unit 200 may sequentially provide scan signals to pixels arranged in multiple rows during the Display period of the first display frame period DFT1. These pixels may emit light to display an image in the order of selection by the scan signals. The display driving unit 200 may not provide the scan signals and the data voltages to the pixels during the display waiting period DW of the first display frame period DFT1. During the display waiting period DW, the voltages in the pixels may be initialized.

The touch driving unit 400 may drive the touch sensing unit TSU in synchronization with the display driving unit 200. The touch driving unit 400 may receive timing control signals from a main processor or a main controller, and thus may be synchronized with the display driving unit 200. For example, the touch driving unit 400 may drive the touch sensing unit TSU at a driving frequency that is N times (where N is a natural number) higher than the driving frequency at which the display driving unit 200 drives the display unit DU. The touch sensing unit TSU may be driven at a different frequency in another embodiment.

The touch driving unit 400 may drive the touch sensing unit TSU at a predetermined driving frequency, e.g., 120 Hz or another frequency. The touch driving unit 400 may drive the touch sensing unit TSU, for example, during a plurality of first through eighth touch frame periods SFT1 through SFT8 that are determined by the driving frequency of the touch sensing unit TSU. For example, the touch driving unit 400 may provide touch driving signals to a plurality of touch electrodes SEN during a touch sensing period of the first touch frame period SFT1, and may stop providing the touch driving signals during a touch waiting period WS of the first touch frame period SFT1.

In one embodiment, the touch sensing period of each of the first through eighth touch frames SFT1 through SFT8 may include a mutual capacitance period MS and a self-capacitance period SS. During the mutual capacitance period MS, the touch driving unit 400 may provide touch driving signals to the driving electrodes TE and receive touch sensing signals from the sensing electrodes RE. During the mutual capacitance period MS, the touch driving unit 400 may sense variations in the mutual capacitances between the driving electrodes TE and the sensing electrodes RE. By sensing the mutual capacitance variations, the touch driving unit 400 may determine the presence of touch input from the user and may precisely calculate the touch coordinates of the touch input.

During the self-capacitance period SS, the touch driving unit 400 may provide touch driving signals to the driving electrodes TE and the sensing electrodes RE, and may receive touch sensing signals from the driving electrodes TE and the sensing electrodes RE. The touch driving unit 400 may sense charge variations in the driving electrodes TE and the sensing electrodes based on the touch sensing signals. Because the touch driving unit 400 can sense self-capacitance variations, the touch driving unit 400 can allow the user to enter a high-sensitivity touch input (e.g., even with a glove on) and can detect the presence of touch input from the user, for example, even when there exists moisture on a touch screen.

The touch driving unit 400 may sequentially perform the self-capacitance period SS, the mutual capacitance period MS, and a touch waiting period WS during the first touch frame period SFT1. The order in which the self-capacitance period SS, the mutual capacitance period MS, and/or the touch waiting period WS are performed may be different in another embodiment. Also, the length of the mutual capacitance period MS may be greater than the length of the self-capacitance period SS, but the lengths of these periods may be different in other embodiments.

When the display driving unit 200 is being driven in normal mode, the first and second touch frame periods SFT1 and SFT2 may correspond to the first display frame period DFT1. In a case where the display driving unit 200 drives the display unit DU during Display periods and the touch driving unit 400 drives the touch sensing unit TSU during self-capacitance periods SS and mutual capacitance periods MS, image quality distortions DST visible to a user may occur due to changes in harmonic components.

Figure 9:
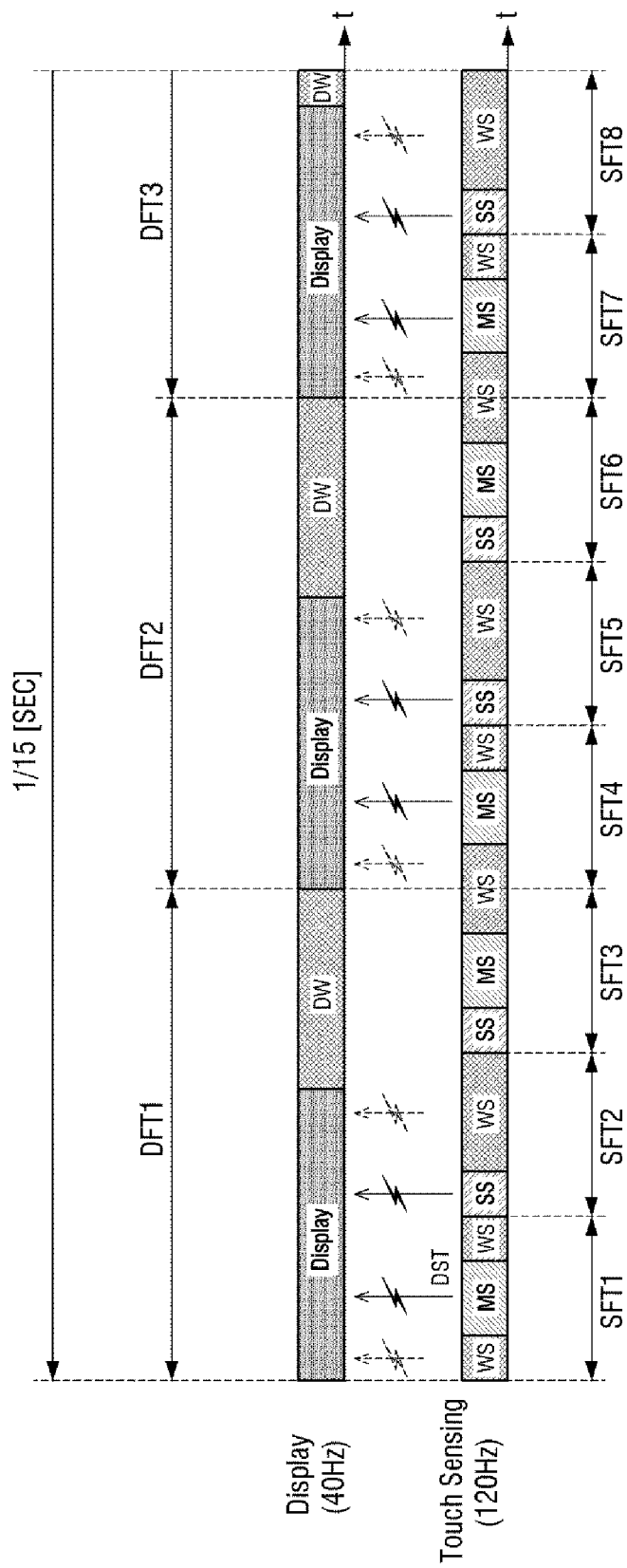
FIG. 9 illustrates an embodiment of a timing diagram for operating a display driving unit and touch driving unit in a second (or first slow) mode.

FIG. 9 is a timing diagram illustrating an embodiment of the operation of the display driving unit and the touch driving unit of the display device of FIG. 1 in a first slow mode.

Referring to FIGS. 8 and 9, the display driving unit 200 may be switched from the normal mode to the first slow mode. In the first slow mode, the display driving unit 200 may drive the display unit DU at a different driving frequency (e.g., 40 Hz) from normal mode. The display driving unit 200 may provide scan signals and data voltages to the pixels during Display periods and may stop providing the scan signals and the data voltages during display waiting periods DW.

The touch driving unit 400 may drive the touch sensing unit TSU at a predetermined driving frequency (e.g., 120 Hz) different from the driving frequency. For example, the touch driving unit 400 may drive the touch sensing unit TSU during a plurality of first through eighth touch frame periods SFT1 through SFT8, that may be determined by the driving frequency at which the touch sensing unit TSU is driven. For example, the touch driving unit 400 may sense charge variations in the touch electrodes SEN during self-capacitance periods SS of the first through eighth touch frame periods SFT1 through SFT8, may sense variations in the mutual capacitances between the driving electrodes TE and the sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the first slow mode, the touch driving unit 400 may increase the touch waiting periods WS of the first through eighth touch frame periods SFT1 through SFT8. For example, when the display driving unit 200 is switched from the normal mode to the first slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during the third touch frame period SFT3.

The touch driving unit 400 may drive the touch sensing unit TSU during the fourth, fifth, and sixth touch frame periods SFT4, SFT5, and SFT6 in the same manner as during the first, second, and third touch frame periods SFT1, SFT2, and SFT3.

In one embodiment, the touch driving unit 400 may reduce image quality distortions DST by not performing self-capacitance periods SS or mutual capacitance periods MS from the first and second touch frame periods SFT1 and SFT2 corresponding to the Display period of the first display frame period DFT1. As the image quality distortions DST are reduced, the display quality of the display device 10 can be improved. The touch driving unit 400 can maintain reliability of touch sensitivity by sequentially performing a self-capacitance period SS, a mutual capacitance period MS, and a touch waiting period WS during the third touch frame period SFT3 corresponding to the display waiting period DW of the first display frame period DFT1. Therefore, when the display driving unit 200 is switched to the first slow mode, the touch driving unit 400 can reduce or minimize image quality distortions DST while maintaining the reliability of touch sensitivity.

Figure 10:
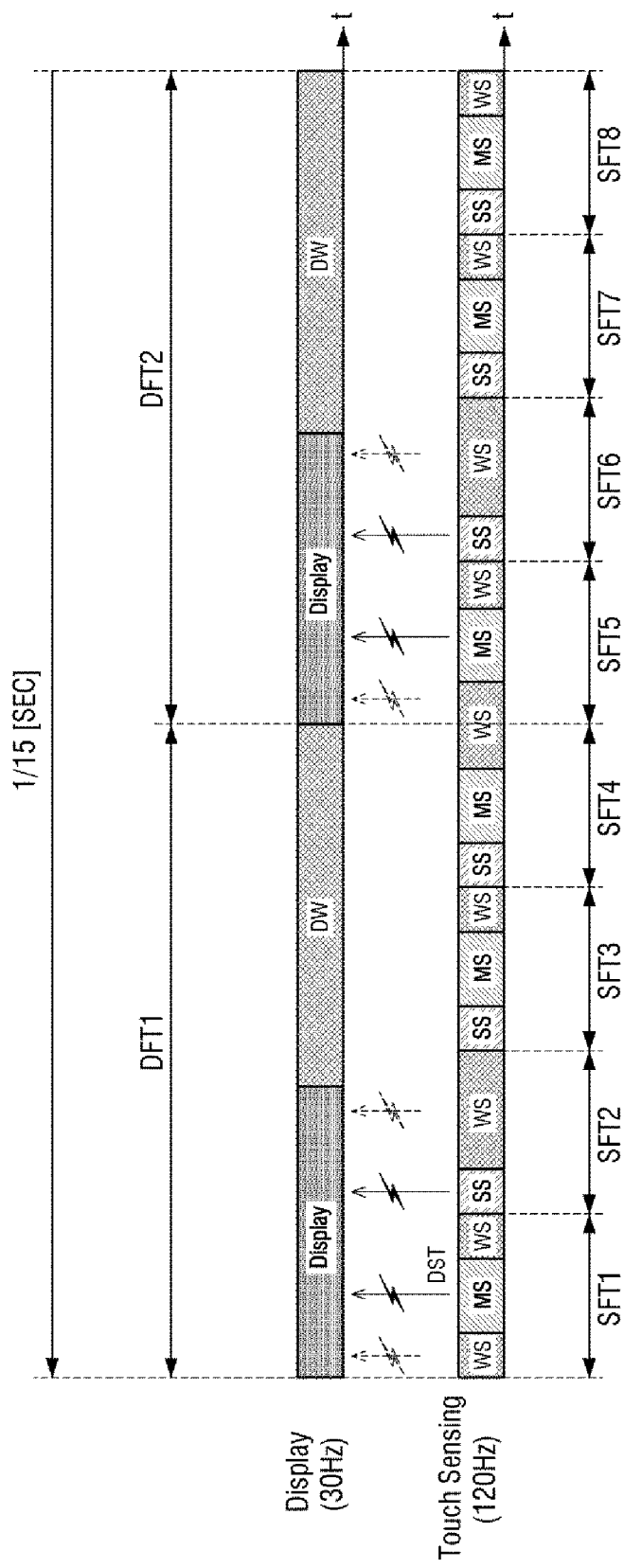
FIG. 10 illustrates an embodiment of a timing diagram for operating a display driving unit and touch driving unit in a third (or second slow) mode.

FIG. 10 is a timing diagram illustrating an embodiment of the operation of the display driving unit and the touch driving unit of the display device of FIG. 1 in a second slow mode.

Referring to FIGS. 8 and 10, the display driving unit 200 may be switched from the normal mode to the second slow mode. In the second slow mode, the display driving unit 200 may drive the display unit DU at a different driving frequency, e.g., 30 Hz. The display driving unit 200 may provide scan signals and data voltages to the pixels during Display periods and may stop providing the scan signals and the data voltages during display waiting periods DW. The length of the Display periods of FIG. 10 may be the same as the length of the Display periods of FIG. 9, but these periods may be different in another embodiment.

The touch driving unit 400 may drive the touch sensing unit TSU at a predetermined driving frequency, e.g., 120 Hz or another frequency. In one embodiment, the touch driving unit 400 may drive the touch sensing unit TSU during a plurality of first through eighth touch frame periods SFT1 through SFT8, that are determined by the driving frequency of the touch sensing unit TSU. For example, the touch driving unit 400 may sense charge variations in the touch electrodes SEN during self-capacitance periods SS of the first through eighth touch frame periods SFT1 through SFT8, may sense variations in the mutual capacitances between the driving electrodes TE and the sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the second slow mode, the touch driving unit 400 may increase the touch waiting periods WS of the first through eighth touch frame periods SFT1 through SFT8. When the display driving unit 200 is switched from the normal mode to the second slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during each of the third and fourth touch frame period SFT3 and SFT4.

The touch driving unit 400 may drive the touch sensing unit TSU during the fifth, sixth, seventh, and eighth touch frame periods SFT5, SFT6, SFT7, and SFT8 in the same manner as during the first, second, third, and fourth touch frame periods SFT1, SFT2, SFT3, and SFT4.

The touch driving unit 400 may reduce image quality distortions DST by not performing self-capacitance periods SS or mutual capacitance periods MS from the first and second touch frame periods SFT1 and SFT2 corresponding to the Display period of the first display frame period DFT1. As image quality distortions DST are reduced, display quality of the display device 10 can be improved. The touch driving unit 400 can maintain reliability of touch sensitivity by sequentially performing a self-capacitance period SS, a mutual capacitance period MS, and a touch waiting period WS during each of the third and fourth touch frame periods SFT3 and SFT4 corresponding to the display waiting period DW of the first display frame period DFT1. Therefore, when the display driving unit 200 is switched to the second slow mode, the touch driving unit 400 can reduce or minimize image quality distortions DST while maintaining the reliability of touch sensitivity.

Figure 11:
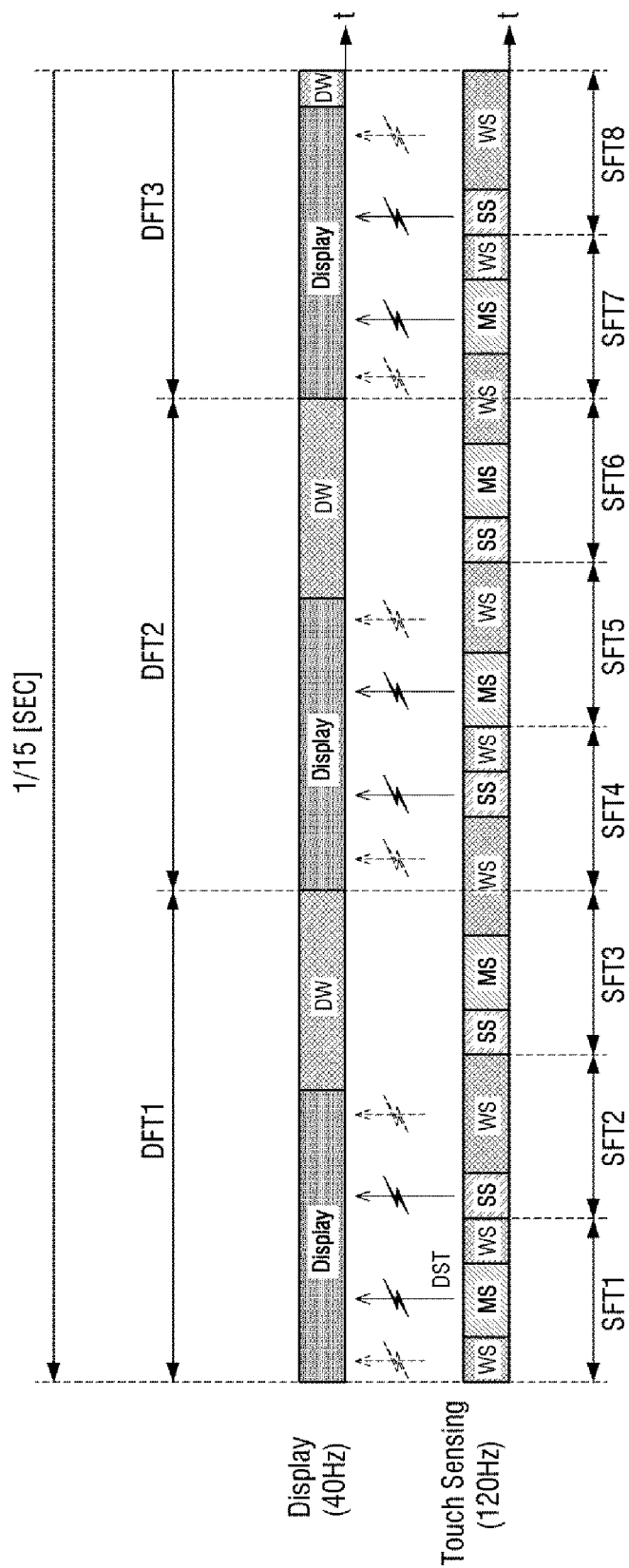
FIG. 11 illustrates an embodiment of a timing diagram for operating a display driving unit and touch driving unit in a second (or first slow) mode.

FIG. 11 is a timing diagram illustrating an embodiment of operation of a display driving unit and a touch driving unit of a display device in a first slow mode.

Referring to FIGS. 8 and 11, a display driving unit 200 may be switched from a normal mode to a first slow mode. In the first slow mode, the display driving unit 200 may drive a display unit DU at a predetermined driving frequency, e.g., 40 Hz. The display driving unit 200 may provide scan signals and data voltages to a plurality of pixels during Display periods and may stop providing the scan signals and the data voltages during display waiting periods DW.

A touch driving unit 400 may drive a touch sensing unit TSU at a predetermined driving frequency, e.g., 120 Hz. The touch driving unit 400 may drive the touch sensing unit TSU during a plurality of first through eighth touch frame periods SFT1 through SFT8, that are determined by the driving frequency of the touch sensing unit TSU. For example, the touch driving unit 400 may sense charge variations in a plurality of touch electrodes SEN during self-capacitance periods SS of the first through eighth touch frame periods SFT1 through SFT8, may sense variations in the mutual capacitances between driving electrodes TE and sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the first slow mode, the touch driving unit 400 may increase the touch waiting periods WS of the first through eighth touch frame periods SFT1 through SFT8. When the display driving unit 200 is switched from the normal mode to the first slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during the third touch frame period SFT3.

The touch driving unit 400 may skip a mutual capacitance period MS from the fourth touch frame period SFT4. The touch driving unit 400 may sequentially perform a touch waiting period WS, a self-capacitance period SS, and a touch waiting period WS during the fourth touch frame period SFT4. The touch driving unit 400 may skip a self-capacitance period SS from the fifth touch frame period SFT5. The touch driving unit 400 may sequentially perform a mutual capacitance period MS and a touch waiting period WS during the fifth touch frame period SFT5.

Image quality distortions DST may occur in pixels in particular rows of the display unit DU during a first display frame period DFT1 (which corresponds to the first touch frame period SFT1) due to the mutual capacitance period MS of the first touch frame period SFT1, and during a second display frame period DFT2 (which corresponds to the fourth touch frame period SFT4) due to the self-capacitance period SS of the fourth touch frame period SFT4. The image quality distortions DST in the pixels in the particular rows of the display unit DU may change from one display frame period to another display frame period and may thus become less visible.

The touch driving unit 400 can maintain reliability of touch sensitivity by sequentially performing a self-capacitance period SS, a mutual capacitance period MS, and a touch waiting period WS during the third touch frame period SFT3 corresponding to a display waiting period DW of the first display frame period DFT1. Therefore, when the display driving unit 200 is switched to the first slow mode, the touch driving unit 400 can reduce or minimize image quality distortions DST while maintaining the reliability of touch sensitivity.

Figure 12:
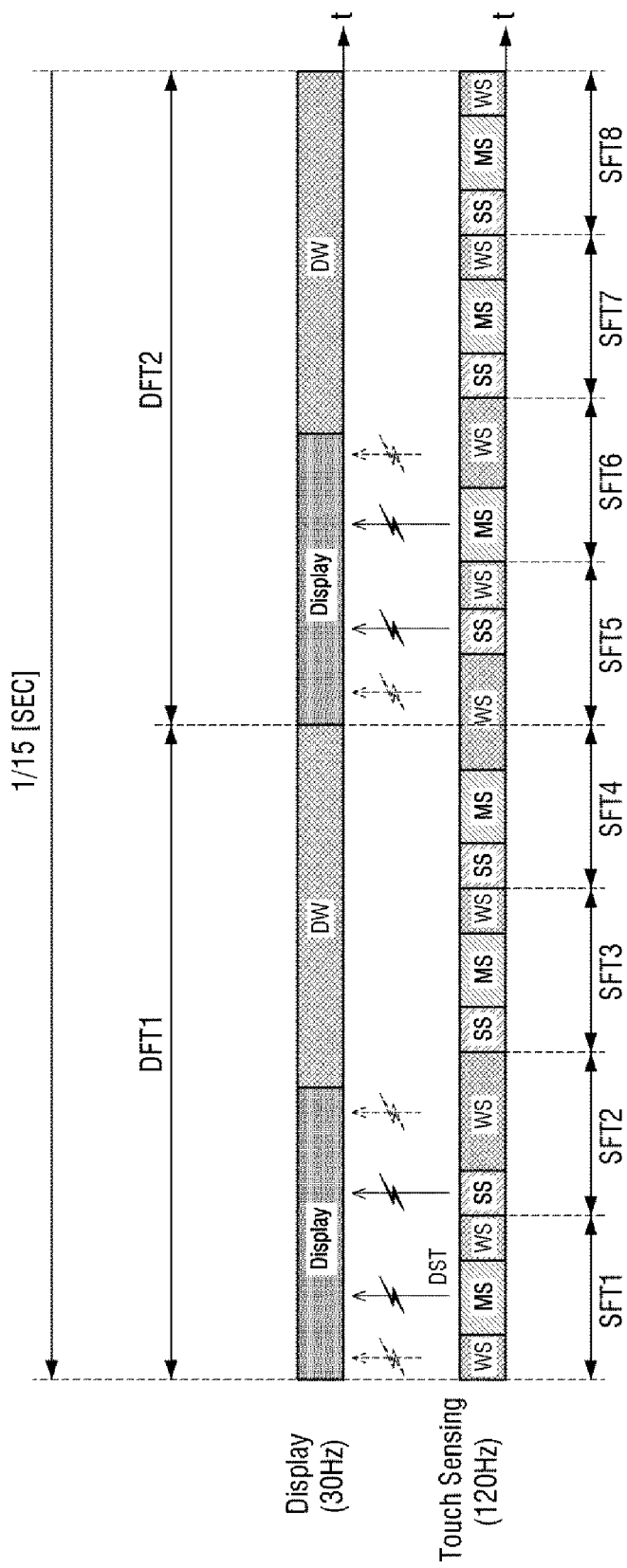
FIG. 12 illustrates an embodiment of a timing diagram for operating a display driving unit and touch driving unit in a third (or second slow) mode.

FIG. 12 is a timing diagram illustrating an embodiment of operation of a display driving unit and a touch driving unit of a display device (e.g., which may correspond to the embodiment of FIG. 11) in a second slow mode.

Referring to FIGS. 8 and 12, the display driving unit 200 may be switched from the normal mode to a second slow mode. In the second slow mode, the display driving unit 200 may drive the display unit DU at a driving frequency, e.g., 30 Hz or another frequency. The display driving unit 200 may provide scan signals and data voltages to the pixels during Display periods and may stop providing the scan signals and the data voltages during display waiting periods DW.

The touch driving unit 400 may drive the touch sensing unit TSU at a predetermined driving frequency, e.g., 120 Hz. The touch driving unit 400 may drive the touch sensing unit TSU during a plurality of first through eighth touch frame periods SFT1 through SFT8, that are determined by the driving frequency of the touch sensing unit TSU. For example, the touch driving unit 400 may sense charge variations in the touch electrodes SEN during self-capacitance periods SS of the first through eighth touch frame periods SFT1 through SFT8, may sense variations in the mutual capacitances between the driving electrodes TE and the sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the second slow mode, the touch driving unit 400 may increase the touch waiting periods WS of the first through eighth touch frame periods SFT1 through SFT8. When the display driving unit 200 is switched from the normal mode to the second slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during each of the third and fourth touch frame periods SFT3 and SFT4.

The touch driving unit 400 may skip a mutual capacitance period MS from the fifth touch frame period SFT5. The touch driving unit 400 may sequentially perform a touch waiting period WS, a self-capacitance period SS, and a touch waiting period WS during the fifth touch frame period SFT5. The touch driving unit 400 may skip a self-capacitance period SS from the sixth touch frame period SFT6. The touch driving unit 400 may sequentially perform a mutual capacitance period MS and a touch waiting period WS during the sixth touch frame period SFT6.

Image quality distortions DST may occur in pixels in particular rows of the display unit DU during a first display frame period DFT1 (which corresponds to the first touch frame period SFT1) due to the mutual capacitance period MS of the first touch frame period SFT1, and during a second display frame period DFT2 (which corresponds to the fifth touch frame period SFT5) due to the self-capacitance period SS of the fourth touch frame period SFT4. The image quality distortions DST in the pixels in the particular rows of the display unit DU may change from one display frame period to another display frame period and may thus become less visible.

The touch driving unit 400 can maintain reliability of touch sensitivity by sequentially performing a self-capacitance period SS, a mutual capacitance period MS, and a touch waiting period WS during each of the third and fourth touch frame periods SFT3 and SFT4 corresponding to a display waiting period DW of the first display frame period DFT1. Therefore, when the display driving unit 200 is switched to the second slow mode, the touch driving unit 400 can reduce or minimize image quality distortions DST while maintaining the reliability of touch sensitivity.

Figure 13:
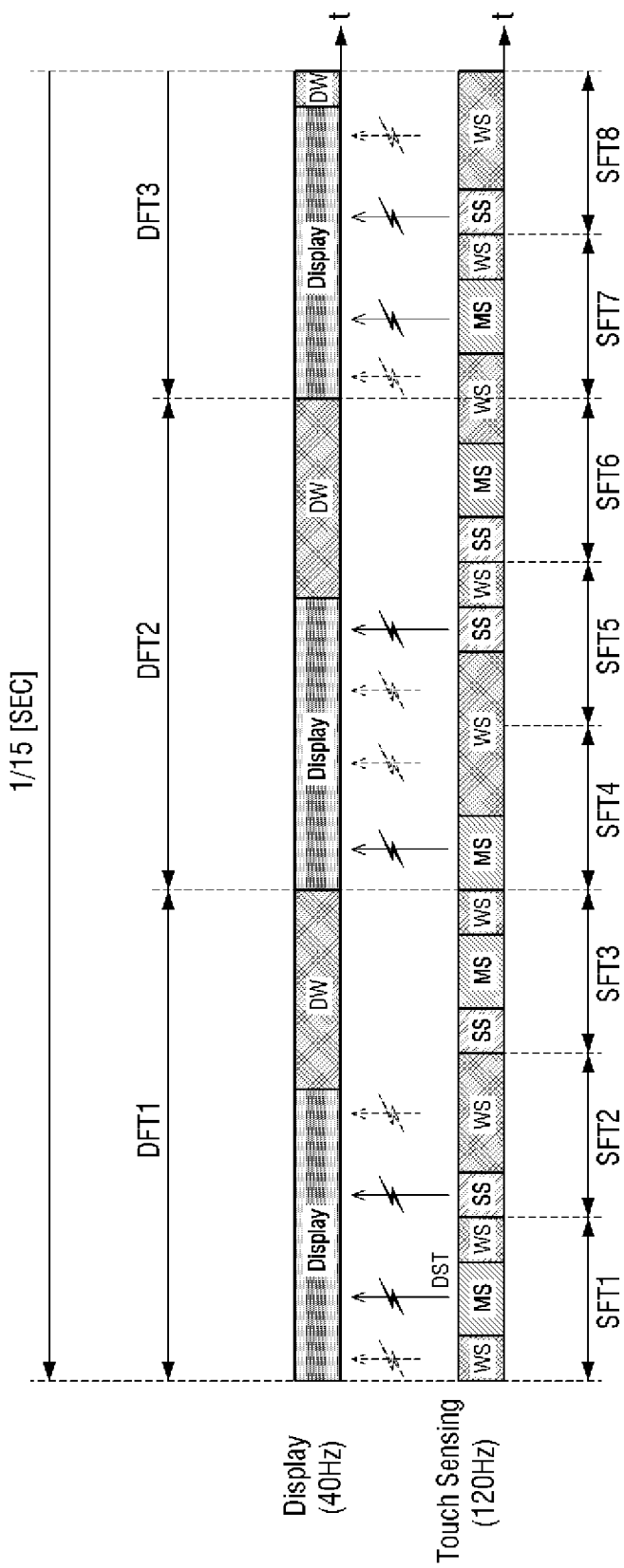
FIG. 13 illustrates an embodiment of a timing diagram for operating a display driving unit and touch driving unit in a second (or first slow) mode.

FIG. 13 is a timing diagram illustrating an embodiment of operation of a display driving unit and a touch driving unit of a display device in a first slow mode.

Referring to FIGS. 8 and 13, a display driving unit 200 may be switched from a normal mode to a first slow mode. In the first slow mode, the display driving unit 200 may drive a display unit DU at a predetermined driving frequency, e.g., 40 Hz. The display driving unit 200 may provide scan signals and data voltages to a plurality of pixels during Display periods and may stop providing the scan signals and the data voltages during display waiting periods DW.

A touch driving unit 400 may drive a touch sensing unit TSU at a predetermined driving frequency, e.g., 120 Hz. The touch driving unit 400 may drive the touch sensing unit TSU during a plurality of first through eighth touch frame periods SFT1 through SFT8, that are determined by the driving frequency of the touch sensing unit TSU. For example, the touch driving unit 400 may sense charge variations in a plurality of touch electrodes SEN during self-capacitance periods SS of the first through eighth touch frame periods SFT1 through SFT8, may sense variations in the mutual capacitances between driving electrodes TE and sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the first slow mode, the touch driving unit 400 may increase the touch waiting periods WS of the first through eighth touch frame periods SFT1 through SFT8. When the display driving unit 200 is switched from the normal mode to the first slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during the third touch frame period SFT3.

The touch driving unit 400 may skip a self-capacitance period SS from the fourth touch frame period SFT4. The touch driving unit 400 may sequentially perform a mutual capacitance period MS and a standby period WS during the fourth touch frame period SFT4. The touch driving unit 400 may skip a mutual capacitance period MS from the fifth touch frame period SFT5. The touch driving unit 400 may sequentially perform a touch waiting period WS, a self-capacitance period SS, and a touch waiting period WS during the fifth touch frame period SFT5.

Image quality distortions DST may occur in pixels in some rows of the display unit DU during a first display frame period DFT1 (which corresponds to the first touch frame period SFT1) due to the mutual capacitance period MS of the first touch frame period SFT1, but not during a second display frame period DFT2 (which corresponds to the fourth touch frame period SFT4) due to the second display frame period DFT2 corresponding to the touch waiting period WS of the fourth touch frame period SFT4. Image quality distortions DST may not occur in pixels in other rows of the display unit DU during the first display frame period DFT1 (due to the first display frame period DFT1 corresponding to the touch waiting period WS of the first touch frame period SFT1), but may occur in the corresponding pixels during the second display frame period DFT2 due to the mutual capacitance period MS of the fourth touch frame period SFT4. Thus, image quality distortions DST may or may not occur in pixels in particular rows of the display unit DU from one display frame period to another display frame period and may thus become less visible.

The touch driving unit 400 can maintain reliability of touch sensitivity by sequentially performing a self-capacitance period SS, a mutual capacitance period MS, and a touch waiting period WS during the third touch frame period SFT3 corresponding to a display waiting period DW of the first display frame period DFT1. Therefore, when the display driving unit 200 is switched to the first slow mode, the touch driving unit 400 can reduce or minimize image quality distortions DST while maintaining the reliability of touch sensitivity.

Figure 14:
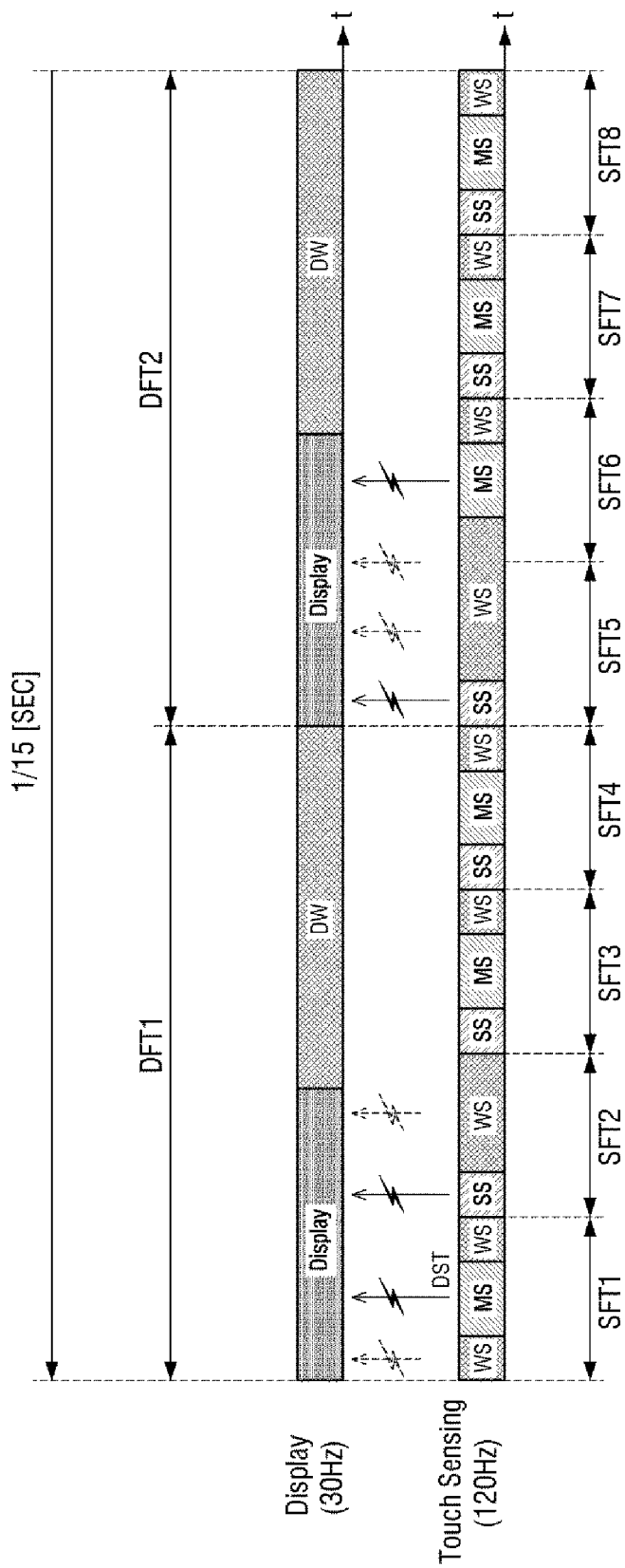
FIG. 14 illustrates an embodiment of a timing diagram for operating a display driving unit and touch driving unit in a third (or second slow) mode.

FIG. 14 is a timing diagram illustrating an embodiment of operation of a display driving unit and a touch driving unit of a display device (e.g., according to the embodiment of FIG. 13) in a second slow mode.

Referring to FIGS. 8 and 14, the display driving unit 200 may be switched from the normal mode to a second slow mode. In the second slow mode, the display driving unit 200 may drive the display unit DU at a predetermined driving frequency, e.g., 30 Hz. The display driving unit 200 may provide scan signals and data voltages to a plurality of pixels during Display periods and may stop providing the scan signals and the data voltages during display waiting periods DW.

The touch driving unit 400 may drive the touch sensing unit TSU at a predetermined driving frequency, e.g., 120 Hz. The touch driving unit 400 may drive the touch sensing unit TSU during a plurality of first through eighth touch frame periods SFT1 through SFT8, that are determined by the driving frequency of the touch sensing unit TSU. For example, the touch driving unit 400 may sense charge variations in the touch electrodes SEN during self-capacitance periods SS of the first through eighth touch frame periods SFT1 through SFT8, may sense variations in the mutual capacitances between the driving electrodes TE and the sensing electrodes RE during mutual capacitance periods MS of the first through eighth touch frame periods SFT1 through SFT8, and may stop providing touch driving signals during touch waiting periods WS of the first through eighth touch frame periods SFT1 through SFT8.

When the display driving unit 200 is switched from the normal mode to the second slow mode, the touch driving unit 400 may increase the touch waiting periods WS of the first through eighth touch frame periods SFT1 through SFT8. When the display driving unit 200 is switched from the normal mode to the second slow mode, the touch driving unit 400 may increase the touch waiting periods WS of the first through eighth touch frame periods SFT1 through SFT8 by skipping one or more of the self-capacitance periods SS and/or one or more of the mutual capacitance periods MS of the first through eighth touch frame periods SFT1 through SFT8.

For example, the touch driving unit 400 may skip a self-capacitance period SS from the first touch frame period SFT1. The touch driving unit 400 may sequentially perform a touch waiting period WS, a mutual capacitance period MS, and a touch waiting period WS during the first touch frame period SFT1. The touch driving unit 400 may skip a mutual capacitance period MS from the second touch frame period SFT2. The touch driving unit 400 may sequentially perform a self-capacitance period SS and a touch waiting period WS during the second touch frame period SFT2. The touch driving unit 400 may sequentially perform a self-capacitance period SS, a mutual capacitance period MS, and a touch waiting period WS during each of the third and fourth touch frame periods SFT3 and SFT4.

The touch driving unit 400 may skip a mutual capacitance period MS from the fifth touch frame period SFT5. The touch driving unit 400 may sequentially perform a self-capacitance period SS and a touch waiting period WS during the fifth touch frame period SFT5. The touch driving unit 400 may skip a self-capacitance period SS from the sixth touch frame period SFT6. The touch driving unit 400 may sequentially perform a touch waiting period WS, a mutual capacitance period MS, and a touch waiting period WS during the sixth touch frame period SFT6.

Image quality distortions DST may occur in pixels in some rows of the display unit DU during a first display frame period DFT1 (which corresponds to the first touch frame period SFT1) due to the mutual capacitance period MS of the first touch frame period SFT1, but not during a second display frame period DFT2 (which corresponds to the fifth touch frame period SFT5) due to the second display frame period DFT2 corresponding to the touch waiting period WS of the fourth touch frame period SFT4. Image quality distortions DST may not occur in pixels in other rows of the display unit DU during the first display frame period DFT1 (due to the first display frame period DFT1 corresponding to the touch waiting period WS of the first touch frame period SFT1), but may occur in the corresponding pixels during the second display frame period DFT2 due to the mutual capacitance period MS of the fifth touch frame period SFT5. Thus, image quality distortions DST may or may not occur in pixels in particular rows of the display unit DU from one display frame period to another display frame period and may thus become less visible.

The touch driving unit 400 can maintain reliability of touch sensitivity by sequentially performing a self-capacitance period SS, a mutual capacitance period MS, and a touch waiting period WS during each of the third and fourth touch frame periods SFT3 and SFT4 corresponding to a display waiting period DW of the first display frame period DFT1. Therefore, when the display driving unit 200 is switched to the second slow mode, the touch driving unit 400 can reduce or minimize image quality distortions DST while maintaining the reliability of touch sensitivity.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, units, parts, multiplexers, generators, logic, interfaces, decoders, managers, drivers, generators and other signal generating and signal processing features of the embodiments disclosed herein may be implemented, for example, in non-transitory logic that may include hardware, software, or both. When implemented at least partially in hardware, the controllers, processors, devices, managers, parts, modules, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, units, multiplexers, generators, managers, parts, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Although the embodiments of the present disclosure have been described, it is understood that various changes and modifications can be made by one ordinary skilled in the art within the spirit and scope of the present disclosure as hereinafter claimed. Also, the embodiments disclosed in the present disclosure are not intended to limit the technical ideas of the present disclosure, and technical ideas within the following claims and their equivalents should be interpreted to be included in the scope of right in the present disclosure. The embodiments may be combined to form additional embodiments.

What is claimed is:

1. A display device, comprising:
a display panel including pixels;
a touch sensor on the display panel and including touch electrodes;
a touch driver configured to drive the touch sensor at a first frequency, provide touch driving signals to the touch electrodes during a touch sensing period of a touch frame period, and stop providing the touch driving signals during a touch waiting period of the touch frame period; and
a display driver configured to drive the display panel at a second frequency lower than the first frequency in a first mode, provide scan signals to the pixels during a display period of a display frame period, and stop providing the scan signals during a display waiting period of the display frame period, wherein when the display driver is switched from the first mode to a second mode, the display driver is configured to drive the display panel at a third frequency lower than the second frequency, and the touch driver is configured to increase the touch waiting period of the touch frame period when the display panel is driven at the third frequency that is lower than the second frequency.

2. The display device of claim 1, wherein when the display driver is driven in the first mode:
the touch sensing period includes a mutual capacitance period and a self-capacitance period,
during the mutual capacitance period, the touch driver is configured to provide the touch driving signals to some of the touch electrodes and sense variations in mutual capacitances between the touch electrodes based on touch sensing signals received from other touch electrodes, and
during the self-capacitance period, the touch driver is configured to provide the touch driving signals to the touch electrodes and sense charge variations in the touch electrodes.

3. The display device of claim 2, wherein:
when the display driver is driven in the first mode, the touch driver is configured to sequentially perform the self-capacitance period, the mutual capacitance period, and the touch waiting period during the touch frame period.

4. The display device of claim 2, wherein:
when the display driver is switched to the second mode, the touch driver is configured to skip the mutual capacitance period or the self-capacitance period from the touch frame period.

5. The display device of claim 2, wherein:
when the display driver is switched from the first mode to the second mode, the touch driver is configured to skip the self-capacitance period from a first touch frame period corresponding to a display period of a first display frame period and to skip the mutual capacitance period from a second touch frame period that follows the first touch frame period.

6. The display device of claim 2, wherein:
when the display driver is switched from the first mode to a third mode, the display driver is configured to drive the display at a fourth frequency lower than the third frequency, and the touch driver is configured to increase a touch waiting period of a touch frame period corresponding to the display period.

7. The display device of claim 6, wherein,
when the display driver is switched from the first mode to the third mode, the touch driver is configured to skip the mutual capacitance period or the self-capacitance period from the touch frame period.

8. The display device of claim 6, wherein a touch frame period corresponding to one display waiting period in the third mode is longer than a touch frame period corresponding to one display waiting period in the second mode.

9. The display device of claim 6, wherein a length of a display period of a display frame period in the second mode is substantially equal to a length of a display period of a display frame period in the third mode.

10. The display device of claim 6, wherein:
when the display driver is switched from the first mode to the third mode, the touch driver is configured to skip the self-capacitance period from a first touch frame period corresponding to a display period of a first display frame period and to skip the mutual capacitance period from a second touch frame period that follows the first touch frame period.

11. The display device of claim 10, wherein:
when the display driver is switched from the first mode to the third mode, the touch driver is configured to skip the self-capacitance period from a third touch frame period corresponding to a display period of a second display frame period that follows the first display frame period and to skip the mutual capacitance period from a fourth touch frame period that follows the third touch frame period.

12. The display device of claim 10, wherein:
when the display driver is switched from the first mode to the third mode, the touch driver is configured to skip the mutual capacitance period from a third touch frame period corresponding to a display period of a second display frame period that follows the first display frame period and to skip the self-capacitance period from a fourth touch frame period that follows the third touch frame period.

13. The display device of claim 10, wherein:
when the display device is driven in the third mode, the touch driver is configured to sequentially perform the self-capacitance period and the touch waiting period during a third touch frame period corresponding to a display period of a second display frame period that follows the first display frame period, and to sequentially perform the touch waiting period, the mutual capacitance period, and the touch waiting period during a fourth touch frame period that follows the third touch frame period.

14. A display device, comprising:
a display panel including pixels;
a touch sensor on the display panel and including touch electrodes;
a touch driver configured to drive the touch sensor at a first frequency, provide touch driving signals to the touch electrodes during a touch sensing period of a touch frame period, and stop providing the touch driving signals during a touch waiting period of the touch frame period; and
a display driver configured to drive the display panel at a second frequency lower than the first frequency in a first mode, provide scan signals to the pixels during a display period of a display frame period, and stop providing the scan signals during a display waiting period of the display frame period, wherein when the display driver is switched from the first mode to a second mode, the display driver is configured to drive the display panel at a third frequency lower than the second frequency, and the touch driver is configured to increase the touch waiting period of the touch frame period,
wherein when the display driver is driven in the first mode:
the touch sensing period includes a mutual capacitance period and a self-capacitance period,
during the mutual capacitance period, the touch driver is configured to provide the touch driving signals to some of the touch electrodes and sense variations in mutual capacitances between the touch electrodes based on touch sensing signals received from other touch electrodes, and
during the self-capacitance period, the touch driver is configured to provide the touch driving signals to the touch electrodes and sense charge variations in the touch electrodes,
when the display driver is driven in the second mode, the touch driver is configured to sequentially perform the touch waiting period, the mutual capacitance period, and the touch waiting period during a first touch frame period corresponding to a display period of the first display frame period and to sequentially perform the self-capacitance period and the touch waiting period during a second touch frame period that follows the first touch frame period.

15. The display device of claim 14, wherein:
when the display driver is switched from the first mode to the second mode, the touch driver is configured to skip the self-capacitance period from a third touch frame period corresponding to a display period of a second display frame period that follows the first display frame period and to skip the mutual capacitance period from a fourth touch frame period that follows the third touch frame period.

16. The display device of claim 14, wherein:
when the display driver is driven in the second mode, the touch driver is configured to sequentially perform the touch waiting period, the mutual capacitance period, and the touch waiting period during a third touch frame period corresponding to a display period of a second display frame period that follows the first display frame period, and to sequentially perform the self-capacitance period and the touch waiting period during a fourth touch frame period that follows the third touch frame period.

17. The display device of claim 14, wherein:
when the display driver is switched from the first mode to the second mode, the touch driver is configured to skip the mutual capacitance period from a third touch frame period corresponding to a display period of a second display frame period that follows the first display frame period and to skip the self-capacitance period from a fourth touch frame period that follows the third touch frame period.

18. The display device of claim 14, wherein:
when the display driver is configured to be driven in the second mode, the touch driver is configured to sequentially perform the touch waiting period, the self-capacitance period, and the touch waiting period during a third touch frame period corresponding to a display period of a second display frame period that follows the first display frame period, and to sequentially perform the mutual capacitance period and the touch waiting period during a fourth touch frame period that follows the third touch frame period.

19. The display device of claim 14, wherein:
when the display driver is driven in the second mode, the touch driver is configured to sequentially perform the mutual capacitance period and the touch waiting period during a third touch frame period corresponding to a display period of a second display frame period that follows the first display frame period, and to sequentially perform the touch waiting period, the self-capacitance period, and the touch waiting period during a fourth touch frame period that follows the third touch frame period.

20. The display device of claim 14, wherein:
when the display driver is configured to be driven in the second mode, the touch driver is configured to sequentially perform the self-capacitance period, the mutual capacitance period, and the touch waiting period during a touch frame period corresponding to the display waiting period.

21. An apparatus, comprising:
a touch driver configured to drive a touch sensor of a display device,
wherein the touch driver configured to:
  drive the touch sensor based on a first touch waiting period of a first touch frame period when a display driver of the display device is in a first mode, and
  drive the touch sensor based on a second touch waiting period of a second touch frame period when the display driver is in a second mode, wherein the first touch waiting period is of a different duration from the second touch waiting period and wherein the touch driver is configured to drive the touch sensor at a frequency different from at least one frequency of the display driver in the first mode or the second mode,
wherein when the display driver is in the first mode, the touch driver is configured to sequentially perform a self-capacitance period, a mutual capacitance period, and the first touch waiting period during the first touch frame period.

\* \* \* \* \*